(12) United States Patent
Kano

(10) Patent No.: US 10,601,428 B2
(45) Date of Patent: *Mar. 24, 2020

(54) CIRCUIT DEVICE, OSCILLATOR, ELECTRONIC APPARATUS, AND MOVING OBJECT

(71) Applicant: Seiko Epson Corporation, Tokyo (JP)

(72) Inventor: Shinnosuke Kano, Minowa (JP)

(73) Assignee: Seiko Epson Corporation (JP)

( * ) Notice: Subject to any disclaimer, the term of this patent is extended or adjusted under 35 U.S.C. 154(b) by 334 days.

This patent is subject to a terminal disclaimer.

(21) Appl. No.: 15/366,291

(22) Filed: Dec. 1, 2016

(65) Prior Publication Data

US 2017/0163265 A1 Jun. 8, 2017

(30) Foreign Application Priority Data

Dec. 3, 2015 (JP) ................................ 2015-236403

(51) Int. Cl.
| | |
|---|---|
| *G01N 27/00* | (2006.01) |
| *G08B 19/00* | (2006.01) |
| *G08B 21/00* | (2006.01) |
| *G01J 5/00* | (2006.01) |
| *G01K 7/00* | (2006.01) |
| *G05D 23/20* | (2006.01) |
| *G08B 13/18* | (2006.01) |
| *G08B 27/00* | (2006.01) |
| *H03L 1/02* | (2006.01) |
| *H03B 5/24* | (2006.01) |
| *H03B 5/36* | (2006.01) |

(Continued)

(52) U.S. Cl.
CPC ............ *H03L 1/026* (2013.01); *H03B 5/24* (2013.01); *H03B 5/362* (2013.01); *H03M 1/46* (2013.01); *H03M 1/66* (2013.01)

(58) Field of Classification Search
CPC .......... H03L 1/026; H03M 1/46; H03M 1/66; H03B 5/24; H03B 5/362
USPC ..................... 331/66, 69, 70, 176
See application file for complete search history.

(56) References Cited

U.S. PATENT DOCUMENTS 6,271,736 B1 * 8/2001 Kim ....................... H03L 1/026
 331/116 FE
2013/0265180 A1 10/2013 Matsumoto et al.
(Continued)

FOREIGN PATENT DOCUMENTS

| JP | 64-082809 A | 3/1989 |
|---|---|---|
| JP | H05-056356 A | 3/1993 |

(Continued)

*Primary Examiner* — Richard Tan
(74) *Attorney, Agent, or Firm* — Harness, Dickey & Pierce, P.L.C.

(57) ABSTRACT

A circuit device includes a D/A converter, a comparator that compares a temperature detection voltage from a temperature sensor unit with a D/A conversion voltage from the D/A converter, and a processing circuit that executes a determination process based on a comparison result from the comparator, and obtains temperature detection data as a result of A/D conversion of the temperature detection voltage, in which the processing circuit determines the temperature detection data so that a change in the temperature detection data at a second output timing following a first output timing with respect to the temperature detection data at the first output timing is equal to or less than k×LSB.

20 Claims, 21 Drawing Sheets

(51) Int. Cl.
*H03M 1/46* (2006.01)
*H03M 1/66* (2006.01)

(56) References Cited

U.S. PATENT DOCUMENTS

2014/0152392 A1* 6/2014 Owaki .................... H03H 9/10
 331/68
2014/0191889 A1* 7/2014 Haneda ................ H03M 1/069
 341/118

FOREIGN PATENT DOCUMENTS

| | | |
|---|---|---|
| JP | 05-113434 A | 5/1993 |
| JP | H10-242756 A | 9/1998 |
| JP | 2002-217733 A | 8/2002 |
| JP | 2011-223404 A | 11/2011 |
| JP | 2012-163356 A | 8/2012 |
| JP | 2013-191976 A | 9/2013 |
| JP | 2013-211611 A | 10/2013 |
| JP | 2014-236398 A | 12/2014 |

* cited by examiner

| D[14:0] | NUMBER OF CLOCKS | | NUMBER OF COMPARISONS | TOTAL NUMBER OF CLOCKS | CONVERSION TIME | |
|---|---|---|---|---|---|---|
| | SAMPLE | COMPARATOR | | | TARGET BIT | INTEGRATION |
| 14 | 2 | 2 | 2 | 8 | 62.5 | 62.5 |
| 13 | | | | | | |
| 12 | 2 | 2 | 3 | 12 | 93.75 | 156.25 |
| 11 | | | | | | |
| 10 | 2 | 2 | 3 | 12 | 93.75 | 250 |
| 9 | | | | | | |
| 8 | 2 | 2 | 3 | 12 | 93.75 | 343.75 |
| 7 | | | | | | |
| 6 | 2 | 2 | 3 | 12 | 93.75 | 437.5 |
| 5 | | | | | | |
| 4 | 2 | 6 | 3 | 24 | 187.5 | 625 |
| 3 | | | | | | |
| 2 | 4 | 12 | 3 | 48 | 375 | 1000 |
| 1 | | | | | | |
| 0 | 8 | 24 | 2 | 64 | 500 | 1500 |
| | | | | | (μsec) | (μsec) |

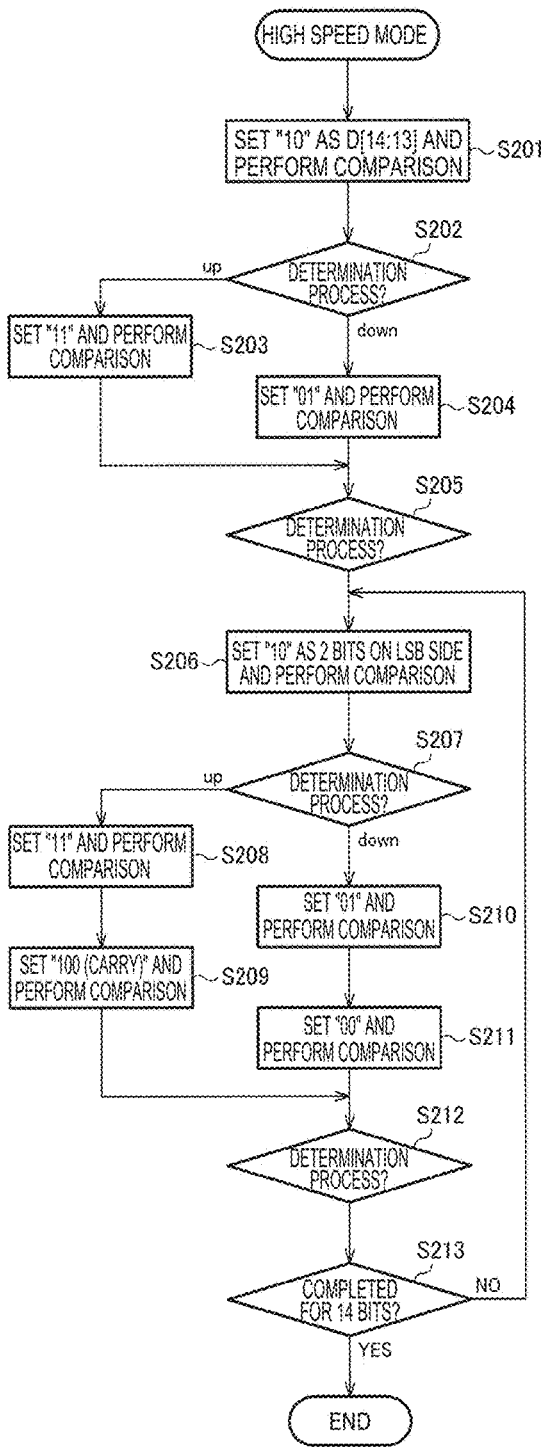

| DETERMINATION TARGET BIT | SET VALUE | DB[14:0] | D0[14:0] | DETERMINATION RESULT | |
|---|---|---|---|---|---|
| D[14:13] | "10"←C1<br>"11"←C2 | 000 0000 0000 0000<br>100 0000 0000 0000 | 100 0000 0000 0000 (INITIAL VALUE) | up<br>up | DETERMINE D[14:13] TO BE "11"←C3 |
| D[12:11] | "10"←C4<br>"01"←C5<br>"00"←C6 | 110 0000 0000 0000<br>110 1000 0000 0000<br>110 0000 0000 0000 | 110 1000 0000 0000←C3 | down<br>up<br>up | DETERMINE D[12:11] TO BE "01"←C7 |
| D[10:9] | "10"<br>"11"<br>"100" | 110 1010 0000 0000<br>110 1011 0000 0000<br>110 1000 0000 0000←C8 | 110 1000 0000 0000←C7 | up<br>up(down)<br>down(up) | DETERMINE D[10:9] TO BE "11" |
| D[8:7] | "10"<br>"11"<br>"100" | 110 1101 1000 0000<br>110 1101 1000 0000<br>110 1100 0000 0000 | 110 1100 0000 0000 | up<br>down<br>down | DETERMINE D[8:7] TO BE "11" AND BORROW |
| D[6:5] | "10"<br>"11"<br>"100" | 110 1110 0010 0000<br>110 1110 0110 0000<br>110 1110 0000 0000 | 110 1110 0000 0000 | up<br>up<br>up | DETERMINE D[6:5] TO BE "100 (CARRY)" |
| D[4:3] | "10"<br>"11"<br>"100" | 110 1110 0001 0000<br>110 1110 0001 1000<br>110 1110 0000 1000 | 110 1110 0001 0000 | up<br>down<br>down | DETERMINE D[4:3] TO BE "10" |
| D[2:1] | "10"<br>"01"<br>"00" | 110 1110 0001 0010<br>110 1110 0001 0010<br>110 1110 0001 0000 | 110 1110 0001 0000 | down<br>down(up)<br>up(down) | DETERMINE D[2:1] TO BE "00" |
| D[0] | PRESENT VALUE<br>ADD 1LSB | 110 1110 0001 0000<br>110 1110 0001 0001 | 110 1110 0001 0000 | | PERFORM DETERMINATION IN THE SAME MANNER AS IN NORMAL MODE |

TIME →

FIG. 15

CIRCUIT DEVICE, OSCILLATOR, ELECTRONIC APPARATUS, AND MOVING OBJECT

BACKGROUND

1. Technical Field

The present disclosure relates to a circuit device, an oscillator, an electronic apparatus, and a moving object.

2. Related Art

In the related art, an A/D conversion circuit which performs analog-digital conversion (hereinafter, referred to as A/D conversion) for converting an analog signal to digital data is widely known. As types of A/D conversion circuit, there are various types such as a flash type, a successive comparison type, and a ΔΣ type. For example, JP-A-2011-223404 discloses a method of performing successive comparison type A/D conversion.

There are various circuits using temperature detection data which is a result of A/D conversion of a temperature detection signal (analog signal) from a temperature sensor unit. For example, in the related art, a temperature compensated crystal oscillator (TCXO) is known. The TCXO is used as, for example, a reference signal source or the like in portable communication terminals, GPS related apparatuses, wearable apparatuses, on-vehicle apparatuses, and the like. A technique disclosed in JP-A-64-82809 is known as related art for a DTCXO which is a digital type temperature compensated oscillator.

If A/D conversion result data as a result of A/D conversion greatly changes in a short period of time, a problem may occur. For example, in a digital type oscillator such as a DTCXO, if a frequency drift of an oscillation frequency caused by a temperature change exceeds, for example, an allowable frequency drift range, it has been proved that various problems occur in an apparatus using an oscillation signal of the oscillator. In other words, it is necessary to suppress a change in temperature detection data which is A/D conversion result data in order to reduce the frequency drift.

It has been proved that a temperature change in a single A/D conversion period under a natural condition is not great. In other words, in a case where temperature detection data at a predetermined output timing is obtained, a change width of temperature detection data at the next output timing may be restricted to a narrow range to some extent.

However, in the technique of the related art disclosed in JP-A-2011-223404 or JP-A-64-82809, none of the above-described content is taken into consideration, and inefficient A/D conversion is performed as a result of permitting a great change in temperature detection data or not taking into consideration the natural condition.

SUMMARY

An advantage of some aspects of the present disclosure is to provide a circuit device, an oscillator, an electronic apparatus, and a moving object, capable of efficiently performing A/D conversion by minimizing defects caused by a rapid change in temperature detection data.

An aspect of the present disclosure relates to a circuit device including a D/A converter; a comparison portion that compares a temperature detection voltage from a temperature sensor unit with a D/A conversion voltage from the D/A converter; and a processing portion that performs a determination process on the basis of a comparison result from the comparison portion, and obtains temperature detection data as a result of A/D conversion of the temperature detection voltage on the basis of the determination process, in which, in a case where the minimum resolution of data in A/D conversion is indicated by LSB, the temperature detection data at a first output timing is set as first temperature detection data, and the temperature detection data at a second output timing following the first output timing is set as second temperature detection data, the processing portion obtains the temperature detection data so that a change in the second temperature detection data with respect to the first temperature detection data is equal to or less than k×LSB (where k is an integer satisfying k<j; and j is an integer representing a resolution in A/D conversion).

In the aspect of the present disclosure, a value which changes within a range of k×LSB or less from temperature detection data at the previous output timing is determined to be temperature detection data at a predetermined output timing. In the above-described way, it is possible to suppress a rapid change in temperature detection data and thus to minimize a defect caused by the change.

In the aspect of the present disclosure, the circuit device may further include a register portion that stores result data including intermediate result data or final result data. Here, the processing portion may perform the determination process on the basis of a comparison result from the comparison portion, and performs an update process on the result data on the basis of the determination process, and the D/A converter may perform D/A conversion on the result data having undergone the update process.

With this configuration, result data is updated by performing a determination process based on a comparison result, and thus it is possible to appropriately update temperature detection data.

In the aspect of the present disclosure, the comparison portion may compare the D/A conversion voltage into which the D/A converter converts previous the result data with the temperature detection voltage, and the processing portion may perform the determination process on the basis of the comparison result, and performs the update process of updating the result data in a range of k×LSB or less.

With this configuration, the present result data can be obtained on the basis of comparison between a D/A conversion voltage of the previous result data with a temperature detection voltage.

In the aspect of the present disclosure, the comparison portion may compare the D/A conversion voltage into which the D/A converter converts the previous final result data corresponding to the temperature detection data at the previous output timing with the temperature detection voltage so as to output a first comparison result; the comparison portion may compare the D/A conversion voltage into which the D/A converter converts data which is obtained by updating the previous final result data in the range of k×LSB or less, with the temperature detection voltage, so as to output a second comparison result; and the processing portion may perform the determination process based on the first comparison result and the second comparison result, and perform the update process of updating the previous final result data in the range of k×LSB or less on the basis of the determination process and of determining the updated data to be the present final result data.

With this configuration, it is possible to determine a value which changes within a range of k×LSB or less from the previous final result data to be the present final result data (temperature detection data) on the basis of a plurality of comparison results.

In the aspect of the present disclosure, the comparison portion may compare the D/A conversion voltage into which the D/A converter converts the previous final result data corresponding to the temperature detection data at the previous output timing with the temperature detection voltage so as to output a first comparison result; the comparison portion compares the D/A conversion voltage into which the D/A converter converts second data which is obtained by adding 1LSB to the previous final result data, with the temperature detection voltage, so as to output a second comparison result; in a case where a result of the determination process based on the first comparison result is an up determination in which the temperature detection voltage is higher than the D/A conversion voltage, and a result of the determination process based on the second comparison result is also the up determination, the processing portion determines the second data to be the present final result data; and, in a case where a result of the determination process based on the first comparison result is a down determination in which the temperature detection voltage is lower than the D/A conversion voltage, and a result of the determination process based on the second comparison result is also the down determination, the processing portion determines data obtained by subtracting 1LSB from the previous final result data, to be the present final result data.

With this configuration, it is possible to determine a value which changes by ±1LSB from the previous final result data to be the present final result data (temperature detection data) on the basis of two comparison results.

In the aspect of the present disclosure, the comparison portion may compare the D/A conversion voltage into which the D/A converter converts the previous final result data corresponding to the temperature detection data at the previous output timing is compared with the temperature detection voltage so as to output a first comparison result; the comparison portion may compare the D/A conversion voltage into which the D/A converter converts second data which is obtained by subtracting 1LSB from the previous final result data, with the temperature detection voltage, so as to output a second comparison result; in a case where a result of the determination process based on the first comparison result is an up determination in which the temperature detection voltage is higher than the D/A conversion voltage, and a result of the determination process based on the second comparison result is also the up determination, the processing portion determines data obtained by adding 1LSB to the previous final result data, to be the present final result data; and, in a case where a result of the determination process based on the first comparison result is a down determination in which the temperature detection voltage is lower than the D/A conversion voltage, and a result of the determination process based on the second comparison result is also the down determination, the processing portion determines the second data to be the present final result data.

With this configuration, it is possible to determine a value which changes by ±1LSB from the previous final result data to be the present final result data (temperature detection data) on the basis of two comparison results.

In the aspect of the present disclosure, in a case where one of a result of the determination process based on the first comparison result and a result of the determination process based on the second comparison result is the up determination, and the other thereof is the down determination, the processing portion may determine the previous final result data to be the present final result data.

With this configuration, it is possible to determine a value of the previous final result data to be the present final result data (temperature detection data) on the basis of two comparison results.

In the aspect of the present disclosure, an A/D conversion period may be set so that a change amount of the temperature detection voltage in a single A/D conversion period is equal to or less than a voltage corresponding to k×LSB.

With this configuration, it is possible to set an A/D conversion period having an appropriate length on the basis of an expected change amount of a temperature detection voltage (in a broad sense, an expected temperature change).

In the aspect of the present disclosure, the circuit device may further include an A/D conversion unit that includes the D/A converter, the comparison portion, and the processing portion; a digital signal processing unit that performs a temperature compensation process on an oscillation frequency on the basis of the temperature detection data, so as to output frequency control data of the oscillation frequency; and an oscillation signal generation circuit that generates an oscillation signal having the oscillation frequency set by the frequency control data by using the frequency control data from the digital signal processing unit and a resonator.

With this configuration, it is possible to implement a circuit such as a DTCXO which performs a temperature compensation process based on a temperature detection voltage so as to output an oscillation signal.

Another aspect of the present disclosure relates to an oscillator including any of the circuit devices described above; and the resonator.

Still another aspect of the present disclosure relates to an electronic apparatus including any one of the circuit devices described above.

Yet another aspect of the present disclosure relates to a moving object including any one of the circuit devices described above.

BRIEF DESCRIPTION OF THE DRAWINGS

The present disclosure will be described with reference to the accompanying drawings, wherein like numbers reference like elements.

FIG. 14A is a flowchart for explaining a process in the high speed mode, and FIGS. 14B and 14C illustrate specific examples of a determination process.

FIG. 15 illustrates a specific example of transition of result data in the high speed mode.

DESCRIPTION OF EXEMPLARY EMBODIMENTS

Figure 1A:
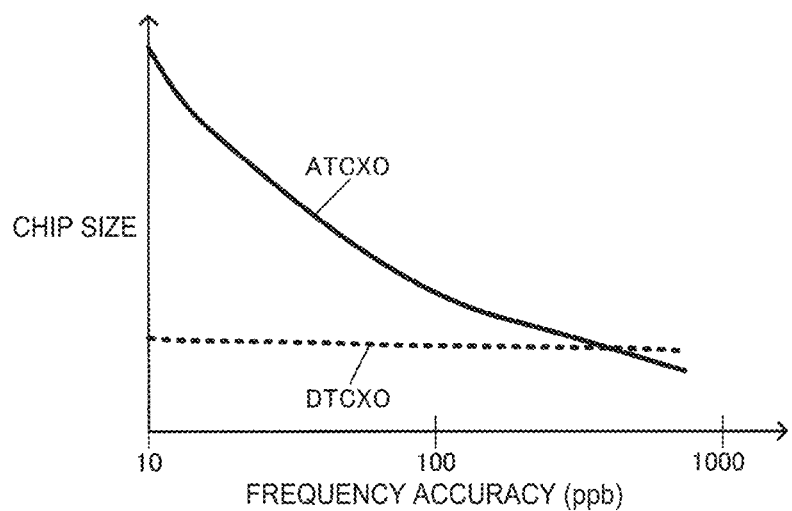
FIGS. 1A, 1B and 1C are diagrams for explaining advantages and problems of a DTCXO.

Hereinafter, preferred embodiments of the present disclosure will be described in detail. The present embodiment described below is not intended to improperly limit the content of the present disclosure disclosed in the appended claims, and all constituent elements described in the present embodiment are not essential as solving means of the present disclosure.

1. Technique of Present Embodiment

1.1 Summary of Normal Operation Mode

First, a technique of the present embodiment will be described. There is a circuit device which acquires digital data by A/D-converting a predetermined analog signal, particularly, a circuit device which performs various processes, for example, in a digital signal processing unit (for example, a digital signal processor (DSP)) on the basis of the digital data. As an example, there is a DTCXO which performs a temperature compensation process of a frequency through digital processing on the basis of temperature detection data which is an A/D conversion result of a temperature detection voltage from a temperature sensor unit.

There are various requests related to A/D conversion in such a circuit device. For example, there is a case where a change in a value of A/D conversion result data is required to be small to some extent. In a case where a value of the A/D conversion result data greatly changes in a short period, for example, in a case where a change in values of A/D conversion result data at a predetermined output timing and A/D conversion result data at the next output timing is too great, a defect may occur due to the change.

For example, in a digital type oscillator such as a DTCXO, there is a problem in that a communication error or the like occurs in a communication device provided with the oscillator due to a drift of an oscillation frequency. In the digital type oscillator, a temperature detection voltage from a temperature sensor unit is A/D-converted, a temperature compensation process is performed on frequency control data on the basis of obtained temperature detection data, and an oscillation signal is generated on the basis of the frequency control data. In this case, if a value of the frequency control data greatly changes due to a temperature change, it has been proved that a problem of frequency hopping occurs due to this. If the frequency hopping occurs, a problem occurs that, for example, GPS locking in a GPS related communication device is canceled. In order to minimize the occurrence of such a problem, it is necessary to reduce a change in temperature detection data used for the temperature compensation process. As will be described later, frequency hopping may be minimized through processing in portions (for example, processing in a digital signal processing unit) other than an A/D conversion portion, and such techniques may be used in combination of each other in the circuit device of the present embodiment.

A circuit device using A/D conversion result data, particularly, temperature detection data DTD into which a temperature detection voltage VTD A/D-converted is not limited to the DTCXO. For example, it is known that an output from a gyro sensor has temperature characteristics, and an error occurs in output data due to the temperature characteristics. Thus, a process (for example, a zero point correction process) of compensating for the temperature characteristics of the output from the gyro sensor may be performed on the basis of the temperature detection data DTD, and a circuit device in the present embodiment may be used for the gyro sensor.

Hereinafter, a brief description will be made of a problem of a frequency drift which may occur in a case where a digital type DTCXO is employed as a TCXO. In the TCXO which is a temperature compensated oscillator, there are requests for improvement of frequency accuracy and low power consumption. For example, in a wearable apparatus such as a GPS-built wristwatch or an apparatus measuring biological information such as a pulse wave, it is necessary to increase a continuous operation time using a battery. Thus, it is required for the TCXO as a reference signal source to secure frequency accuracy and also to consume less power.

Various methods have been proposed as communication methods between a communication terminal and a base station. For example, in a time division duplex (TDD) method, each apparatus transmits data in an allocated time slot. A guard time is set between time slots (an uplink slot and a downlink slot), and thus overlapping between time slots is prevented. In a communication system of the next generation, a technique is proposed in which data communication is performed in the TDD method by using a single frequency bandwidth (for example, 50 GHz).

However, in a case where such a TDD method is employed, it is necessary for each apparatus to perform time synchronization, and thus an accurate absolute time is required to be measured. In order to realize such a request, for example, there may be a technique in which an atomic clock (atomic oscillator) is provided in each apparatus as a reference signal source, but a problem such as causing high cost or a large-sized apparatus occurs.

In a case where an ATCXO (analog type TCXO) is used as a reference signal source, if frequency accuracy is to be increased, as illustrated in FIG. 1A, a chip size of a circuit device increases, and thus it is hard to realize low cost or low power consumption. On the other hand, the DTCXO has an advantage in that frequency accuracy can be increased without increasing a chip size of a circuit device as illustrated in FIG. 1A.

However, since there is the above-described problem such as a frequency drift, various circuit methods have been proposed for a digital type oscillator such as the DTCXO, but the digital type oscillator is scarcely employed as a reference signal source of an actual product in which the communication error is problematic, and the present situation is that an analog type oscillator such as an ATCXO is employed.

Figure 1B:
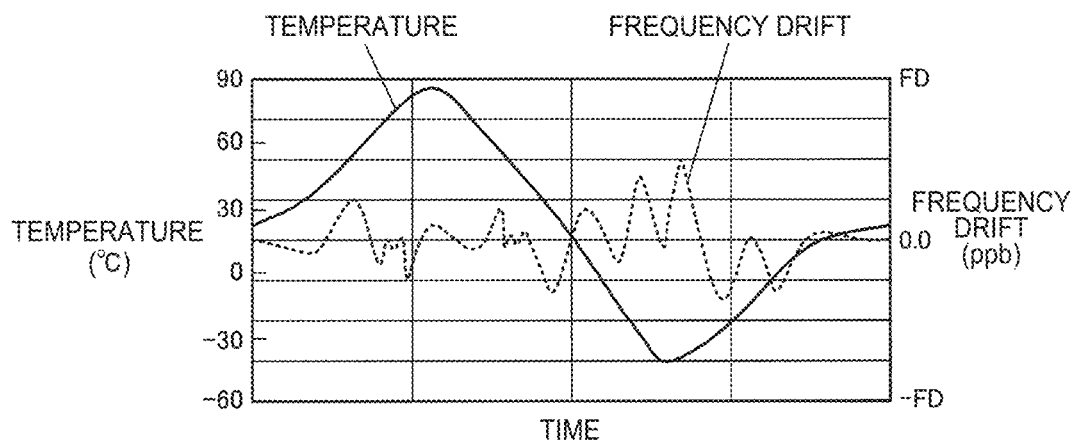

For example, FIG. 1B is a diagram illustrating a frequency drift in the ATCXO. In the ATCXO, as illustrated in FIG. 1B, even in a case where a temperature changes over time, a frequency drift thereof enters an allowable frequency drift (allowable frequency error) range (±FD). In FIG. 1B, the frequency drift (frequency error) is indicated by a proportion (frequency accuracy, ppb) with respect to a nominal oscillation frequency (for example, about 16 MHz).

For example, in order not to cause a communication error, a frequency drift is required to be included in the allowable frequency drift range (±FD) within a predetermined period TP (for example, 20 msec). Here, the FD is, for example, about several ppb.

Figure 1C:
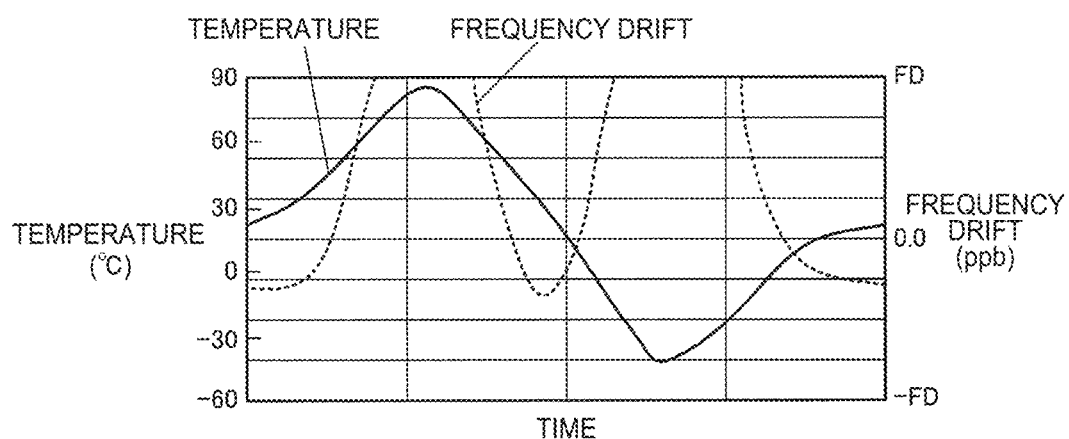

On the other hand, FIG. 1C is a diagram illustrating a frequency drift in a case where a DTCXO of the related art is used. As illustrated in FIG. 1C, in the DTCXO of the related art, frequency hopping occurs in which a frequency drift thereof does not enter the allowable frequency drift range and exceeds the range. Thus, a communication error (unlocking of a GPS) occurs due to the frequency hopping, and this hinders the DTCXO from being employed as a reference signal source of an actual product.

Figure 2:
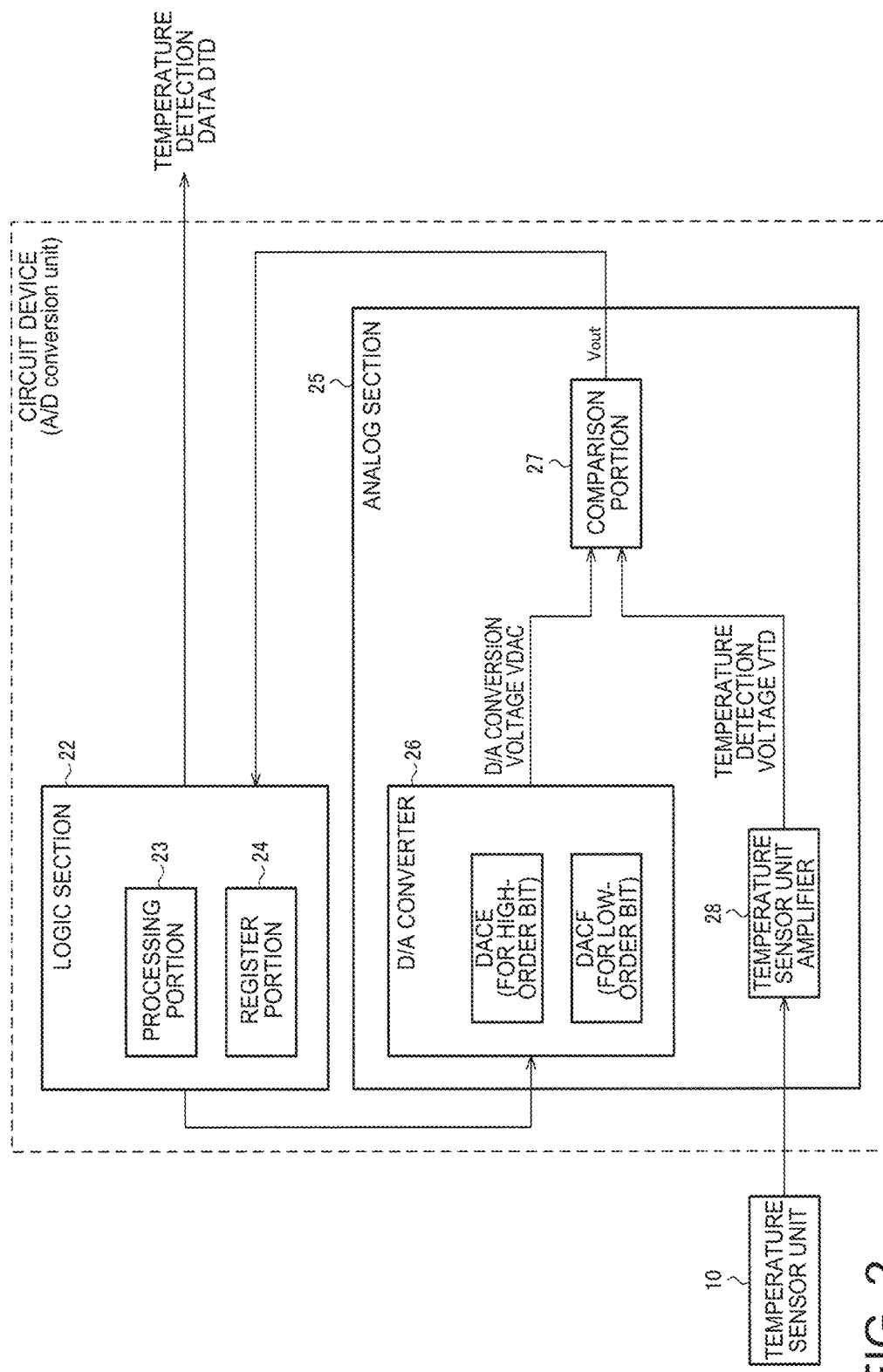
FIG. 2 illustrates a fundamental configuration example of a circuit device according to the present embodiment.

Therefore, the present applicant proposes a technique of suppressing a change in A/D conversion result data. Specifically, a circuit device according to the present embodiment includes, as illustrated in FIG. 2, a D/A converter 26; a comparison portion 27 which compares temperature detection voltage VTD from a temperature sensor unit 10 with D/A conversion voltage VDAC from the D/A converter 26; and a processing portion 23 which performs a determination process on the basis of a comparison result from the comparison portion 27, and obtains temperature detection data DTD as a result of A/D conversion of the temperature detection voltage VTD on the basis of the determination process. In a case where the minimum resolution of data in A/D conversion is indicated by LSB, the temperature detection data DTD at a first output timing is set as first temperature detection data, and the temperature detection data DID at a second output timing following the first output timing is set as second temperature detection data, the processing portion 23 obtains the temperature detection data DTD so that a change in the second temperature detection data with respect to the first temperature detection data is equal to or less than k×LSB (where k is an integer satisfying k<j; and j is an integer representing a resolution in A/D conversion).

The output timing here indicates a timing at which a single item of temperature detection data is output, and, for example, in a case where A/D conversion is performed in 15 bits, the output timing indicates a timing at which A/D conversion result data with 15-bit accuracy is output. As will be described later in detail, in the present embodiment, A/D conversion is performed according to a method corresponding to a successive comparison method in which a plurality of comparison processes are performed by using temporary values (intermediate result data), and A/D conversion result data (final result data=temperature detection data) with 15-bit accuracy is obtained on the basis of results of the plurality of comparison processes. In other words, in order to output a single item of temperature detection data, a single item or a plurality of items of intermediate result data are output as results of a plurality of comparison processes. An output timing of the intermediate result data may include an output timing in the A/D conversion process in a broad sense, but, the "output timing" here indicates an output timing of only final A/D conversion result data (temperature detection data with 15-bit accuracy), and does not indicate an output timing of the intermediate result data.

The integer j indicating a resolution in A/D conversion is a value which depends on the number of bits of A/D conversion result data, and, in a case where the number of bits is p, j may be $2^p$.

According to the technique of the present embodiment, a change in the temperature detection data DTD at two timings adjacent to each other is restricted to k×LSB or less. Since LSB here indicates the minimum resolution of data in the A/D conversion, for example, in a case where a temperature range from T1° C. to T2° C. (>T1) is expressed by p-bit digital data, a change in 1LSB represents a change in temperature corresponding to $(T2-T1)/2^{po}$ C. In a case where this condition is not provided, temperature detection data may change by a maximum of $2^p$ (=j) LSB. The change of $2^p$ LSB corresponds to a case where temperature detection data at the first timing becomes an expected minimum value (maximum value), and temperature detection data at the second timing becomes an expected maximum value (minimum value).

Consequently, in the example of the DTCXO, a change in the temperature detection data is suppressed, and thus there is a high probability that frequency hopping may also enter the allowable frequency drift range. Also in examples other than the DTCXO, a change in the temperature detection data is suppressed, and thus it is possible to reduce the occurrence of defects.

In the present embodiment, it is assumed that the temperature detection data DTD is output by performing A/D conversion on the temperature detection voltage VTD. In this case, there is a rational reason for employment of the technique of the present embodiment in suppression of a change in the temperature detection data DTD. It is known that a temperature change (a change in the environmental temperature) under a natural condition is not great, and, for example, a temperature change of about 0.28° C./sec at the maximum may be taken into consideration. Thus, if a rate of A/D conversion is 2K samples/sec, a temperature change per A/D conversion period, that is, an expected maximum change amount of temperature detection data between a certain output timing and the next output timing is 0.14 m° C./sample.

Here, if a temperature range taken into consideration in the circuit device is 125° C. (for example, T1=−40° C., and 12=85° C.), and p is 15, a temperature change per LSB is $125/2^{15} \cong 4$ m° C./LSB. In other words, as can be seen from comparison between 0.14 m° C./sample and 4 m° C./LSB, it is sufficient to assume a temperature change corresponding to whether or not a value of 1LSB changes while A/D conversion result data is output for thirty times under the natural condition.

As in the technique of the present embodiment, in a case where a change in the temperature detection data DTD which is an output is suppressed, if a difference between an actual temperature and the temperature detection data DTD occurs, this is problematic. For example, in a case where the temperature detection voltage VTD which is an analog signal greatly changes (specifically, the temperature detection data more greatly changes than a voltage value corresponding to k×LSB), the temperature detection data DTD which is output digital data does not track the change (the temperature detection data changes by only k×LSB), and thus a difference between an actual temperature and the temperature detection data DTD occurs. However, in an example in which a change rate and the number of bits are set to the above-described values under the natural condition, an actual temperature change between adjacent output timings is less than 1LSB. Thus, even if a change for the temperature detection data DTD at the previous output timing is restricted to k×LSB (in this example, k=1), it may be considered that there is no difference between an actual temperature and the temperature detection data DTD, and thus appropriate A/D conversion can be performed.

A change in an environmental temperature under the natural condition is defined as a change per unit time (for example, 1 second or 10 seconds) as described above. Thus, a temperature change expected between output timings adjacent to each other occurs according to a length between the output timings adjacent to each other, that is, an A/D conversion period. If the A/D conversion period is long, an expected temperature change increases, and, if the A/D conversion period is short, an expected temperature change decreases.

Therefore, in the present embodiment, an A/D conversion period may be set so that a voltage change amount of the temperature detection voltage VTD in a single A/D conversion period is equal to or less than a voltage corresponding to k×LSB. If such setting is performed, a temperature change (actually, a change amount of the temperature detection voltage VTD due to the change) is equal to or less than k×LSB (actually, equal to or less than a D/A conversion voltage corresponding to k×LSB), and thus it is possible to minimize a difference from an actual temperature even if a change in the temperature detection data DTD is restricted to k×LSB or less.

Here, as described above, a temperature change is defined by using ° C. (or Kelvin) or the like, and thus it is important to understand a correspondence relationship between 1LSB and ° C. For example, in a case where the number of bits (the above-described p) in A/D conversion is reduced, or in a case where a temperature range (125° C. in the above-described example) taken into consideration in the circuit device is widened, if digital data changes by 1LSB, a temperature change expressed by the digital data increases.

If it is taken into consideration that only a condition such as the occurrence of a temperature change corresponding to a change in environmental temperature equal to or less than k×LSB under the natural condition is satisfied, it may appear to be preferable that a temperature per LSB is increased (p is reduced, or a temperature range is widened). However, the original object is to minimize a defect caused by frequency hopping or the like by suppressing a change in A/D conversion result data. In other words, even if a change in A/D conversion result data is restricted to k×LSB or less, if a temperature corresponding to k×LSB is high, a great temperature change is allowed as a result, and thus this is not proper.

Therefore, in the present embodiment, an expected temperature range or an expected number of bits in A/D conversion in the circuit device may be set from the viewpoint of minimizing frequency hopping, an A/D conversion period may be set on the basis of the set condition so that a temperature change corresponding to a temperature change less than k×LSB under the natural condition occurs.

A change in a value is restricted to k×LSB or less, and thus it is possible to perform A/D conversion efficiently (at a high speed). In typical p-bit A/D conversion, all values of $2^p$ become candidates at each output timing, and thus conversion is required to be performed so that all of the values of $2^p$ can be output. For example, in general successive comparison type A/D conversion, a value of each bit of p bits is determined one by one, and thus p comparison processes are required to be performed. In relation to this fact, in the technique of the present embodiment, only a value (change of 0) which does not change, and values of ±1LSB, ±2LSB, ..., and ±k×LSB with respect to the temperature detection data DTD at the previous output timing may be used as candidates. Particularly, if k=1, only three values including a change of 0 and ±1LSB may be taken into consideration as candidates, and thus it is possible to simplify processing required in A/D conversion. Specifically, it is possible to reduce the number of comparison processes in the comparison portion 27, or the number of analog signal generation processes (D/A conversion processes) used for the comparison processes.

In other words, according to the technique of the present embodiment, it is possible to achieve two effects, that is, minimization of defects caused by a rapid change in A/D conversion result data, such as frequency hopping, and realization of an efficient A/D conversion process, and also to minimize a difference between a real temperature and the temperature detection data DTD even if the A/D conversion is performed. Hereinafter, a mode for performing the above-described A/D conversion is referred to as a normal operation mode so as to be differentiated from a high speed mode which will be described later.

1.2 Outline of High Speed Mode

As an optional configuration, in the present embodiment, A/D conversion may be performed in a mode which is different from the above-described normal operation mode. As described above, if a temperature change is taken into consideration under the natural condition, the normal operation mode in which a change in the temperature detection data DTD is restricted to k×LSB or less can be said to be a rational method. However, this is based on appropriate temperature detection data DTD matching an actual temperature (temperature detection voltage VTD) being obtained at a predetermined output timing. For example, when the circuit device is activated or the like, the previous temperature detection data DTD is not acquired. Thus, as an initial value, a certain value, for example, an intermediate value such as "100000000000000" of 15 bits is set, and the initial value has no relation to an actual temperature.

Thus, if the normal operation mode is started from the initial value, even in a case where an actual temperature is greatly different from the initial value, the output temperature detection data DTD changes by only k×LSB for each output, and thus a lot of time is necessary until an output is stabilized.

Figure 3:
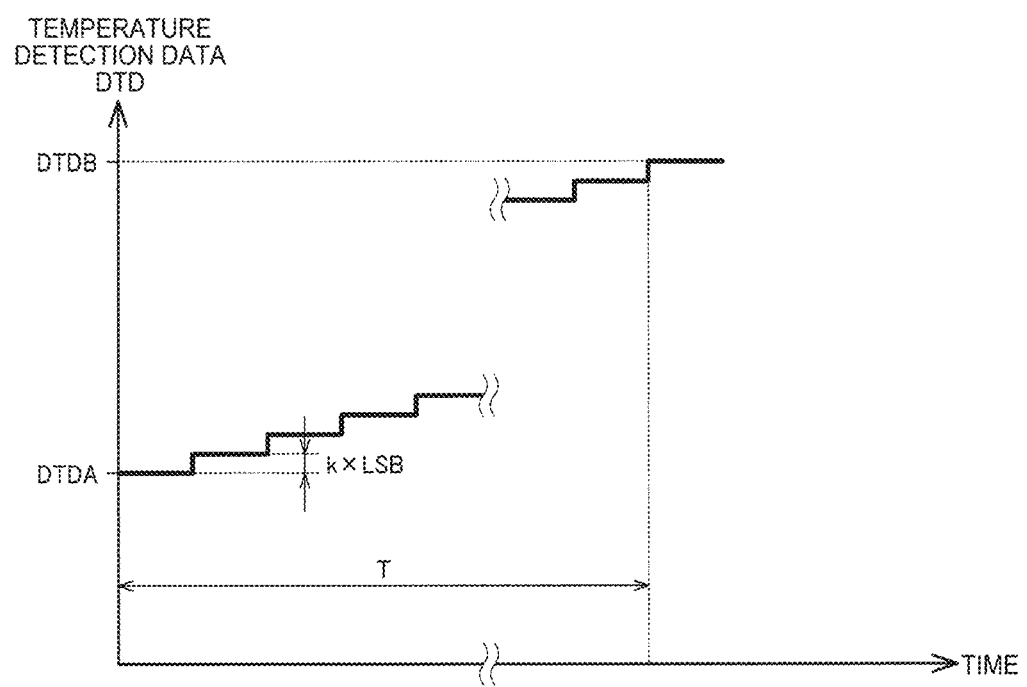
FIG. 3 is a diagram for explaining a problem occurring due to update to k×LSB or less.

FIG. 3 illustrates a temporal change example of the temperature detection data DTD in this case. In FIG. 3, a longitudinal axis expresses the temperature detection data DTD, and a transverse axis expresses time. DTDA indicates an initial value of the temperature detection data DTD, and DTDB indicates a digital value corresponding to an actual temperature. As in general successive comparison type A/D conversion, in a method of obtaining all values of p bits every time, even if a difference between an initial value and an actual temperature is great, temperature detection data corresponding to the actual temperature may be obtained at the next output timing. However, in the normal operation mode of the present embodiment, a change with respect to the previous output is restricted to k×LSB or less. Thus, as illustrated in FIG. 3, even if a difference between DTDA and DTDB is great, the temperature detection data DTD changes stepwise by only k×LSB. As a result, it takes a long time for the temperature detection data DTD to track the actual temperature. For example, in a case where the above-described intermediate value is used as an initial value, and data corresponding to the actual temperature is a value represent by "1111111111111111" or "0000000000000000", the actual temperature finally matches the temperature detection data DTD through $2^{p-1}$ times of outputs if k=1.

Specifically, time T required for stabilization is 10 seconds or more in the worst case depending on setting of an initial value or a length of an A/D conversion period. Since the temperature detection data DTD does not reflect an accurate temperature during that time, there is a problem in that a subsequent process, for example, a temperature compensation process in the DTCXO is not accurately performed. Particularly, this problem is focused since there is an increasing request for fast stabilization of an output after activation.

For example, in a case where the DTCXO is used for communication of a mobile phone, an output frequency is required to be stabilized within 2 msec from activation. For this, the temperature detection data DTD for temperature compensation has to be set to a highly accurate value in the time shorter than 2 msec at worst, and thus the time such as 10 seconds cannot be allowed.

In consideration of the above-described facts, in the present embodiment, A/D conversion may be performed in a mode which is different from the normal operation mode. Specifically, A/D conversion is performed so that an initial value is obtained according to a first A/D conversion method in the activation period, and A/D conversion is performed by using the initial value according to a second A/D conversion method after the activation period is finished. Here, the second A/D conversion method is the normal operation mode, and the first A/D conversion method may be a mode having a high tracking property for an actual temperature.

For example, a first mode may employ general various A/D conversion methods. General A/D conversion methods such as a successive comparison type, a ΔΣ type, or a flash type does not have restriction in a change width with respect to the previous output, and thus the temperature detection data DTD matching an actual temperature can be output as an initial value. If an initial value matching an actual temperature can be determined, subsequently using the normal operation mode has no problem as described above.

However, in a stricter condition, for example, in a case where the highly accurate temperature detection data DTD is required to be output in a period shorter than 2 msec as in the above-described mobile phone, the general method may be insufficient. For example, the ΔΣ type A/D conversion uses an integral circuit, and thus it is hard to output a signal at a high speed. The flash type A/D conversion realizes high speed, but as the number of bits increases, a circuit scale also increases, and thus the flash type A/D conversion is not proper, for example, in a case where 10 bits are exceeded. In the successive comparison type conversion, since comparison processes corresponding to the number of times corresponding to the number of bits are required to be performed, for example, if 15 comparison processes are performed at 2K samples/sec, 7.5 msec is required until an output is obtained, and thus the above-described request is not satisfied.

In a case of the successive comparison type conversion, time required for a comparison process per bit is reduced, and thus it is possible to reduce time required to obtain an output. However, it is known that, if time for a comparison process is reduced, determination accuracy is lowered. In an example of the comparison portion 27 using a chopper circuit which will be described later with reference to FIG. 7A or the like, since time required to turn off a switch S1 and to turn on switches S2 and S3 so as to accumulate electric charge corresponding to the temperature detection voltage VTD in a capacitor C (a sample mode; A1 or A5 in FIG. 8), and time required to turn on the switch S1 and to turn off the switches S2 and S3 so as to output a relationship between the accumulated electric charge and the D/A conversion voltage VDAC (a comparator mode; A2 or A6 in FIG. 8) are respectively reduced, a result of a comparison process is output before a circuit state is stabilized, and thus accuracy is lowered.

On the basis of the above description, in the present embodiment, a mode in which a determination process on A/D conversion result data on a most significant bit (MSB) side is performed in a first determination period, and a determination process on A/D conversion result data on a least significant bit (LSB) side is performed in a second determination period longer than the first determination period may be the first mode. Here, the "MSB side" and the "LSB side" may be variously defined, but, the MSB side may be a bit range of a single bit or a plurality of bits closer to a most significant bit (MSB), and the LSB side may be a bit range of a single bit or a plurality of bits closer to a least significant bit (LSB) than the MSB side. In a narrow sense, the MSB side is a single bit or a plurality of bits including the MSB, and the LSB side is a single bit or a plurality of bits including the LSB.

Hereinafter, the first mode in the above-described way is referred to as a high speed mode. Data on the MSB side indicates a great value, and thus a difference between an analog signal (voltage value) corresponding to a case where a bit is 0 and an analog signal corresponding to a case where a bit is 1 is relatively great. Conversely, data on the LSB side indicates a small value, and thus a difference between an analog signal corresponding to a case where a bit is 0 and an analog signal corresponding to a case where a bit is 1 is relatively small.

In other words, a probability of determination errors can be reduced even if a rough comparison process is performed in the MSB side compared with the LSB side. A period of a determination process on the MSB side is relatively shortened by taking into consideration this fact, and thus it is possible to reduce time required for A/D conversion performed once. There may be various specific numerical examples, and, in an example which will be described later with reference to FIGS. 13A and 13B, A/D conversion result data can be output in the time required of about 1.5 msec.

Hereinafter, the present embodiment will be described in detail. First, a configuration example of the circuit device according to the present embodiment will be described. As will be described later with reference to FIG. 4, a configuration example of a circuit device used in a digital type oscillator such as a DTCXO will be described, but a circuit device according to the present embodiment is not limited thereto. Then, each unit in FIG. 4 will be described in detail. Specifically, as specific techniques of A/D conversion, the normal operation mode and the high speed mode will be described. A digital signal processing unit (DSP), a D/A conversion circuit, a temperature sensor unit, an oscillation circuit, and the like will be described. A description will be made of a technique of minimizing frequency hopping of the DTCXO through processing in the digital signal processing unit. Thereafter, a description will be made of several modification examples, and examples of an electronic apparatus and the like including the circuit device of the present embodiment.

2. Configuration

Figure 4:
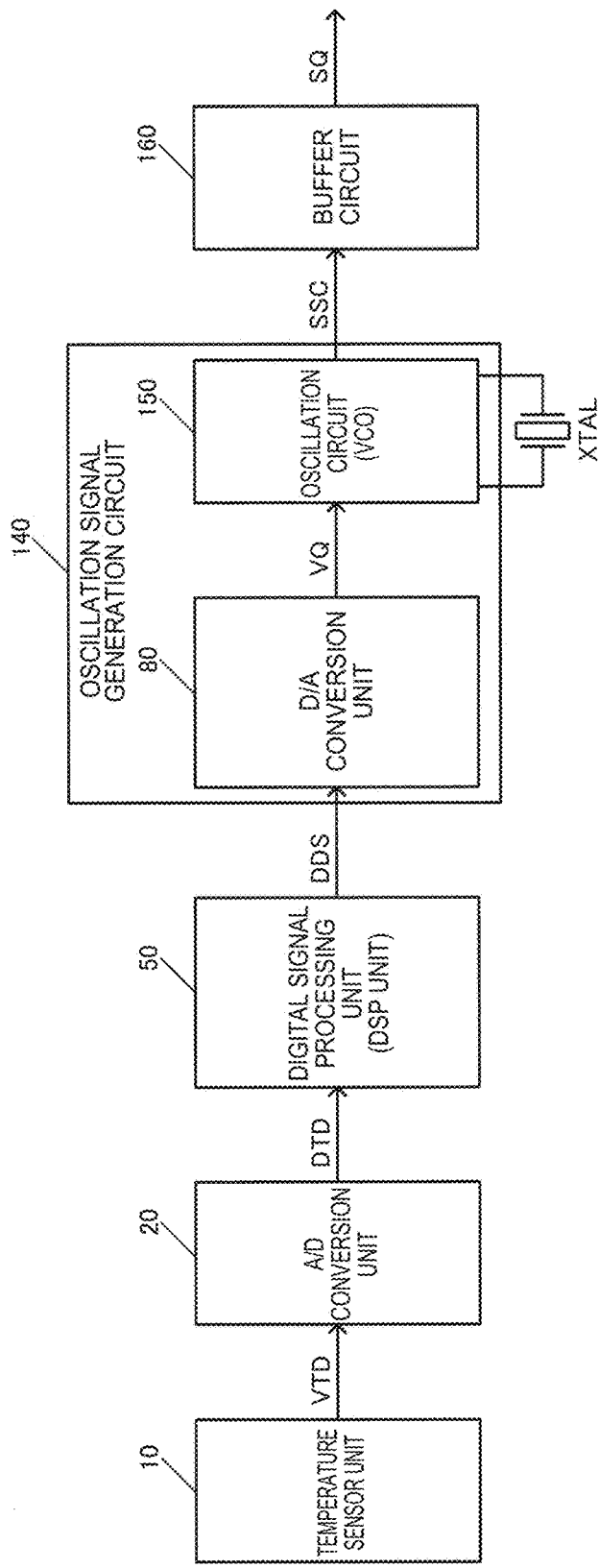
FIG. 4 illustrates a configuration example of a circuit device according to the present embodiment.

FIG. 4 illustrates a configuration example of the circuit device of the present embodiment. The circuit device is a circuit device (semiconductor chip) implementing a digital type oscillator such as a DTCXO or an OCXO. For example, the circuit device and a resonator XTAL are stored in a package, and thus the digital type oscillator is implemented.

The circuit device illustrated in FIG. 4 includes the A/D conversion unit 20, the digital signal processing unit 50, and an oscillation signal generation circuit 140. A configuration of each unit of the circuit device illustrated in FIG. 2 is included in, for example, the A/D conversion unit 20. The circuit device may include the temperature sensor unit 10 and a buffer circuit 160. A configuration of the circuit device is not limited to the configuration illustrated in FIG. 4, and may be variously modified by omitting some constituent elements (for example, the temperature sensor unit and the buffer circuit) or adding other constituent elements thereto.

The resonator XTAL is, for example, a piezoelectric resonator such as a quartz crystal resonator. The resonator XTAL may be an oven type oscillator (OCXO) provided in a thermostatic tank. The resonator XTAL may be a resonator (an electromechanical resonator or an electrical resonance circuit). As the resonator XTAL, a piezoelectric resonator, a surface acoustic wave (SAW) resonator, a microelectromechanical system (MEMS) resonator, and the like may be used. As a substrate metal of the resonator XTAL, a piezoelectric single crystal of quartz crystal, lithium tantalate, or lithium niobate, a piezoelectric material such as piezoelectric ceramics of lead zirconate titanate or the like, or a silicon semiconductor material may be used. The resonator XTAL may be excited due to a piezoelectric effect, and may be excited by using electrostatic driving based on a Coulomb force.

The temperature sensor unit 10 outputs the temperature detection voltage VTD. Specifically, a temperature-dependent voltage which changes according to the temperature of the environment (circuit device) is output as the temperature detection voltage VTD. A specific configuration example of the temperature sensor unit 10 will be described later.

The A/D conversion unit 20 performs A/D conversion on the temperature detection voltage VTD from the temperature sensor unit 10 so as to output the temperature detection data DTD. For example, the digital temperature detection data DTD (A/D conversion result data) corresponding to an A/D conversion result of the temperature detection voltage VTD is output. As an A/D conversion mode of the A/D conversion unit 20, as described above, the normal operation mode and the high speed mode may be used in a switching manner, and details thereof will be described later.

The digital signal processing unit 50 (DSP unit) performs various signal processes. For example, the digital signal processing unit 50 (temperature compensation unit) performs a temperature compensation process on an oscillation frequency (a frequency of an oscillation signal) on the basis of the temperature detection data DTD. Frequency control data DDS of the oscillation frequency is output. Specifically, the digital signal processing unit 50 performs a temperature compensation process for making the oscillation frequency constant on the basis of the temperature detection data DTD (temperature-dependent data) which changes according to a temperature, coefficient data (data regarding coefficients of an approximate function) for temperature compensation processing, even in a case where a temperature changes. The digital signal processing unit 50 may be implemented by an ASIC circuit such as gate arrays, and may be implemented by a processor and a program executed on the processor.

The oscillation signal generation circuit 140 generates an oscillation signal SSC. For example, the oscillation signal generation circuit 140 generates the oscillation signal SSC with an oscillation frequency which is set on the basis of the frequency control data DDS, by using the frequency control data DDS from the digital signal processing unit 50, and the resonator XTAL. As an example, the oscillation signal generation circuit 140 causes the resonator XTAL to oscillate at an oscillation frequency which is set on the basis of the frequency control data DDS, so as to generate the oscillation signal SSC.

The oscillation signal generation circuit 140 may be a circuit which generates the oscillation signal SSC according to a direct digital synthesizer method. For example, the oscillation signal SSC with an oscillation frequency set on the basis of the frequency control data DDS may be digitally generated by using an oscillation signal of the resonator XTAL (an oscillation source for a fixed oscillation frequency) as a reference signal.

The oscillation signal generation circuit 140 may include a D/A conversion unit 80 and an oscillation circuit 150. However, a configuration of the oscillation signal generation circuit 140 is not limited to such a configuration, and may be variously modified by omitting some constituent elements or adding other constituent elements thereto.

The D/A conversion unit 80 performs D/A conversion on the frequency control data DDS (output data from the processing unit) from the digital signal processing unit 50. The frequency control data DDS which is input to the D/A conversion unit 80 is frequency control data (frequency control code) obtained after the temperature compensation process is performed by the digital signal processing unit 50. As a D/A conversion type of the D/A conversion unit 80, a resistance string type (resistance division type) may be employed. However, a D/A conversion type is not limited thereto, and various types such as a resistance ladder type (R-2R ladder type or the like), a capacitor array type, and a pulse width modulation type may be employed. The D/A conversion unit 80 may include not only a D/A converter but also a control circuit, a modulation circuit, a filter circuit, or the like.

The oscillation circuit 150 generates the oscillation signal SSC by using an output voltage VQ from the D/A conversion unit 80, and the resonator XTAL. The oscillation circuit 150 is connected to the resonator XTAL via first and second resonator terminals (resonator pads). For example, the oscillation circuit 150 causes the resonator XTAL (a piezoelectric resonator, a resonator, or the like) to oscillate so as to generate the oscillation signal SSC. Specifically, the oscillation circuit 150 causes the resonator XTAL to oscillate at an oscillation frequency at which the output voltage VQ of the D/A conversion unit 80 is used as a frequency control voltage (oscillation control voltage). For example, in a case where the oscillation circuit 150 is a circuit (VCO) which controls oscillation of the resonator XTAL through voltage control, the oscillation circuit 150 may include a variable capacitance capacitor (varicap or the like) whose capacitance value varies depending on a frequency control voltage.

As described above, the oscillation circuit 150 may be implemented by a direct digital synthesizer type circuit, and, in this case, an oscillation frequency of the resonator XTAL is used as a reference frequency and is different from an oscillation frequency of the oscillation signal SSC.

The buffer circuit 160 buffers the oscillation signal SSC generated by the oscillation signal generation circuit 140 (oscillation circuit 150), and outputs a buffered signal SQ. In other words, buffering for sufficiently driving an external load is performed. The signal SQ is, for example, a clipped sine wave signal. However, the signal SQ may be a rectangular wave signal. Alternatively, the buffer circuit 160 may be a circuit which can output both of a clipped sine wave signal and a rectangular wave signal as the signal SQ.

Figure 5:
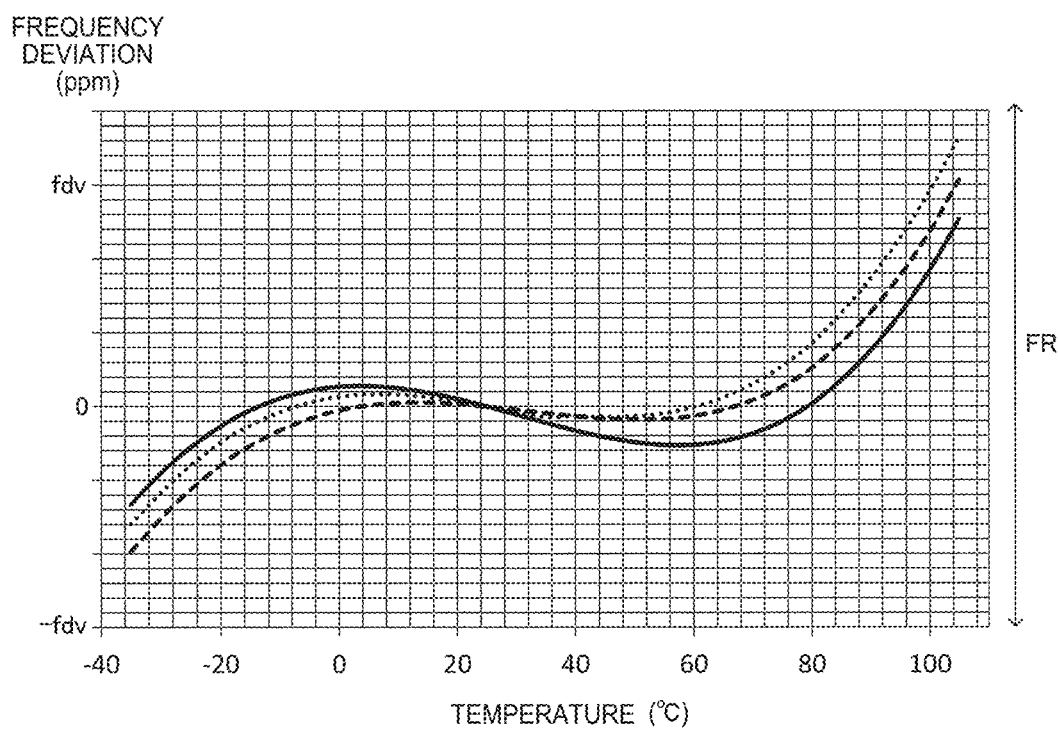
FIG. 5 is a diagram illustrating examples of temperature characteristics of a resonator and variations thereof.

FIG. 5 is a diagram illustrating an example of frequency deviation of an oscillation frequency due to the temperature of the resonator XTAL (AT resonator or the like). The digital signal processing unit 50 performs a temperature compensation process for making an oscillation frequency of the resonator XTAL having temperature characteristics as illustrated in FIG. 5 constant regardless of a temperature.

Figure 6:
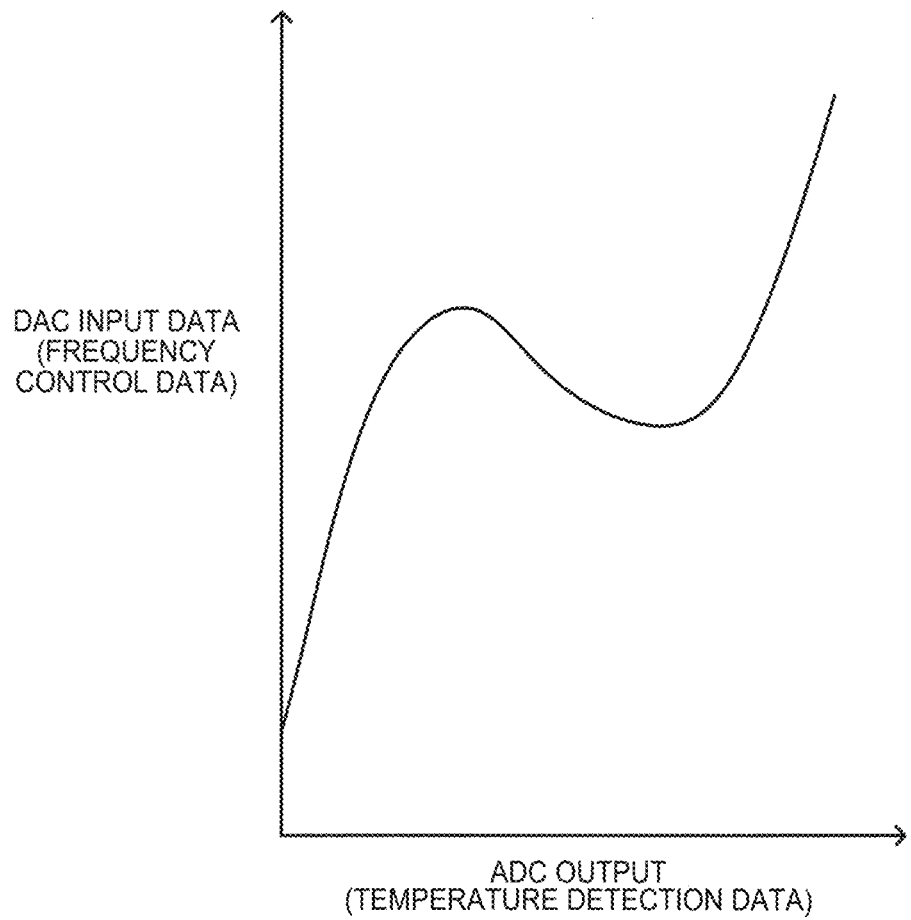
FIG. 6 is a diagram for explaining a temperature compensation process.

Specifically, the digital signal processing unit 50 performs a temperature compensation process so that output data (temperature detection data DTD) of the A/D conversion unit 20 and input data (frequency control data) of the D/A conversion unit 80 have a correspondence relationship as illustrated in FIG. 6. The correspondence relationship (frequency correction table) illustrated in FIG. 6 may be acquired according to a technique in which, for example, an oscillator provided with the circuit device is put into a thermostatic tank, and input data (DDS) of the D/A conversion unit 80 and output data (DTD) of the A/D conversion unit 20 are monitored.

Coefficient data of an approximate function used for temperature compensation for realizing the correspondence relationship illustrated in FIG. 6 is stored in a memory unit (nonvolatile memory) of the circuit device. The digital signal processing unit 50 performs a calculation process on the basis of the coefficient data read from the memory unit and the temperature detection data DTD from the A/D conversion unit 20, and thus realizes a temperature compensation process for making an oscillation frequency of the resonator XTAL constant regardless of a temperature.

The temperature detection voltage VTD from the temperature sensor unit 10 has, for example, negative temperature characteristics as will be described later. Therefore, temperature dependency of an oscillation frequency of the resonator XTAL illustrated in FIG. 5 can be compensated for as a result of being canceled out by using the temperature compensation characteristics as illustrated in FIG. 6.

3. A/D Conversion Unit

Next, the A/D conversion unit 20 will be described in detail. Specifically, a configuration example of the A/D conversion unit 20 will be described, and then each of the normal operation mode and the high speed mode will be described.

3.1 Configuration Example

A configuration example of the A/D conversion unit 20 is the same as illustrated in FIG. 2. As illustrated in FIG. 2, the A/D conversion unit 20 includes the processing portion 23, the register portion 24, the D/A converter 26 (a DACE and a DACF), and the comparison portion 27. The A/D conversion unit 20 may include a temperature sensor unit amplifier 28. The processing portion 23 and the register portion 24 are provided as a logic section 22, and the D/A converter 26, the comparison portion 27, and the temperature sensor unit amplifier 28 are provided as an analog section 25.

The register portion 24 stores result data such as intermediate result data or final result data of the A/D conversion. The register portion 24 corresponds to, for example, a successive comparison result register in a successive comparison method. The D/A converter 26 (the DACE and the DACF) performs D/A conversion on the result data from the register portion 24. Various well-known D/A converters may be employed as the DACE or the DACF. The comparison portion 27 compares an output voltage (D/A conversion voltage VDAC) from the D/A converter 26 with the temperature detection voltage VTD (a voltage amplified by the temperature sensor unit amplifier 28). The comparison portion 27 may be implemented by, for example, a chopper type comparator. The processing portion 23 performs a determination process on the basis of a comparison result in the comparison portion 27, so as to perform a process of updating the result data in the register portion 24. The final temperature detection data DTD obtained through the update process is output from the A/D conversion unit 20 as a result of A/D conversion of the temperature detection voltage VTD. With this configuration, A/D conversion can be realized according to the normal operation mode, the high speed mode, or a general successive comparison method.

Here, the intermediate result data and the final result data are digital data stored in the register portion 24. The final result data corresponds to a single A/D conversion result (the temperature detection data DTD in a case of a temperature), and the intermediate result data is data obtained in the middle of obtaining the final result data. For example, in an example which will be described later with reference to FIG. 15, both of DB and DO are included in result data, but the DB corresponds to intermediate result data. With respect to the DO, a value when a process illustrated in FIG. 15 is completed corresponds to final result data, but a value during the process illustrated in FIG. 15 corresponds to intermediate result data. In a case of the normal operation mode, data obtained by subtracting (adding) 1LSB from (to) the previous final result data corresponds to intermediate result data, and data obtained through a determination process corresponds to final result data.

The D/A converter 26 performs D/A conversion on the result data having undergone the update process in the processing portion 23. Consequently, the result data having undergone the update process can be used as a comparison target with the temperature detection voltage VTD in the next comparison process.

In other words, a cycle is repeated in which a determination process is performed on the basis of a comparison result, an update process is performed on result data on the basis of the determination process, and the result data having undergone the update process is used for the next comparison process, and thus the temperature detection data DTD can be appropriately updated.

Specifically, the comparison portion 27 may compare the D/A conversion voltage VDAC obtained by the D/A converter 26 converting the previous result data, with the temperature detection voltage VTD, and the processing portion 23 may perform a determination process on the basis of a comparison result thereof and perform an update process of updating the result data in a range of k×LSB or less. This corresponds to the normal operation mode which will be described later. Since the updated result data is treated as the "previous temperature detection data DID" in a case where the second next timing is used as a reference, the D/A converter 26 performs a process of performing D/A conversion on the result data so as to output a D/A conversion result to the comparison portion 27. This cycle is repeated, and thus the temperature detection data DTD (final result data) can be updated in the range of k×LSB or less in the normal operation mode.

Figure 7A:
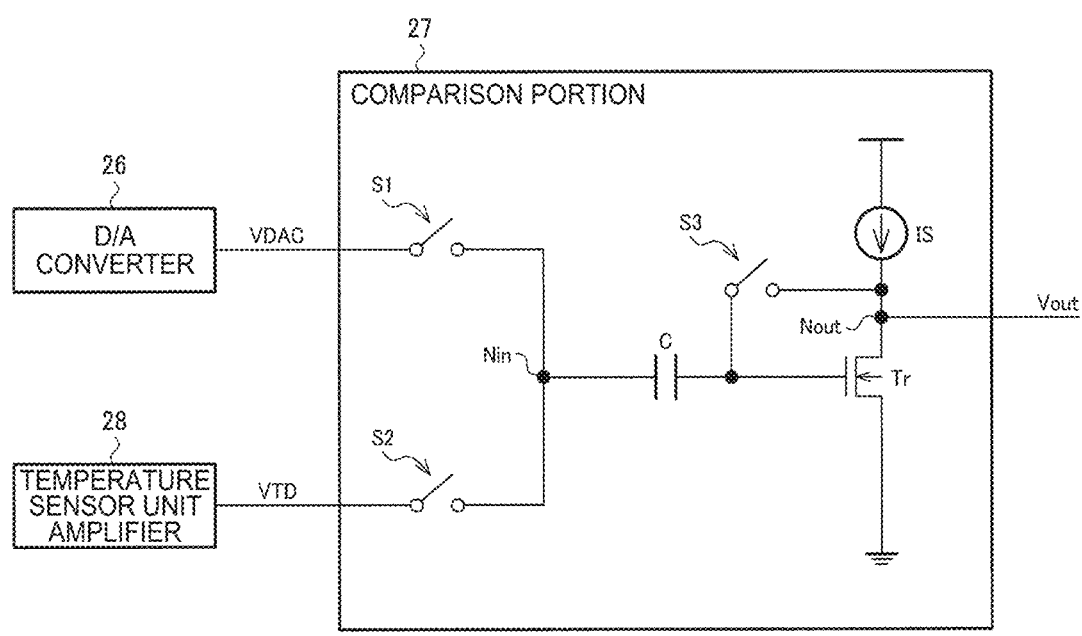
FIGS. 7A, 7B and 7C illustrate configuration examples of a comparison portion.

FIG. 7A illustrates a configuration example of the comparison portion 27. The comparison portion 27 includes a first switch S1 to which an A/D conversion voltage which is a result of the result data in the register portion 24 being D/A-converted by the D/A converter 26 is input; a second switch S2 to which the temperature detection voltage VTD is input; a capacitor C whose one end (input terminal Nin) is connected to the switches S1 and S2; a transistor Tr whose gate terminal is connected to the other end of the capacitor C; a third switch S3 provided between the gate terminal and a drain terminal of the transistor Tr; and a current source IS provided between the drain terminal of the transistor Tr and a high potential side power source terminal. A source terminal of the transistor Tr is connected to a low potential side power source terminal (ground). An output terminal Nout is connected to the drain terminal of the transistor Tr, and an output voltage Vout is output from the output terminal Nout.

Figure 7B:
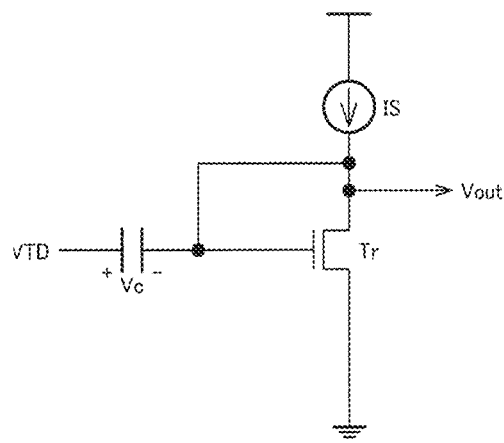

The comparison portion 27 has two modes such as a sample mode and a comparator mode. In the sample mode, the switch S1 is set to be turned off, and the switches S2 and S3 are set to be turned on. FIG. 7B is a schematic diagram illustrating a state in the sample mode. In this case, since a gain of an inverter formed of the current source IS and the transistor Tr becomes 1, an output voltage Vout1 in the sample mode is obtained according to the following Equation (1). In the following Equation (1), Vc indicates a potential difference between both ends of the capacitor C, and Vth indicates a threshold voltage of the transistor Tr.

$$Vout1 = Vth = (VTD + Vc) \quad (1)$$

Figure 7C:
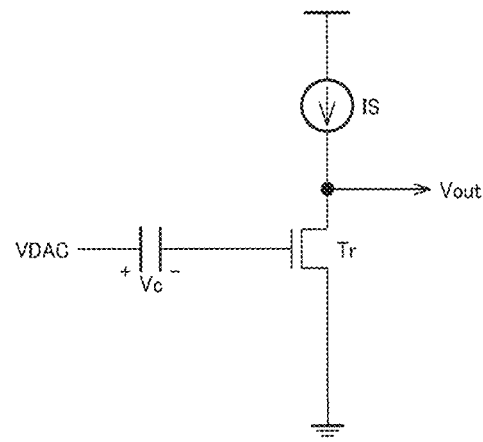

After the sample mode is performed, the comparison portion 27 transitions to the comparator mode. In the comparator mode, the switch S1 is set to be turned on, and the switches S2 and S3 are set to be turned off. FIG. 7C is a schematic diagram illustrating a state in the comparator mode. In a case where a gain of the inverter is set to −Gx, an output voltage Vout2 in the comparator mode is obtained according to the following Equation (2).

$$Vout2 = -Gx \times \{(VDAC + Vc) - Vth\} = -Gx(VDAC - VTD) \quad (2)$$

As mentioned above, turning-on and turning-off of the transistor Tr are determined according to a magnitude relationship between VTD and VDAC. Specifically, if the D/A conversion voltage VDAC is higher than the temperature detection voltage VTD, the transistor Tr is turned on, and thus the output voltage Vout becomes a low potential side power source voltage (for example, the ground). Conversely, if the D/A conversion voltage VDAC is lower than the temperature detection voltage VTD, the transistor Tr is turned off, and thus the output voltage Vout becomes a high potential side power source voltage (for example, VDD). As mentioned above, the temperature detection voltage VTD and the D/A conversion voltage VDAC can be compared with each other on the basis of an output voltage in the comparator mode.

Figure 8:
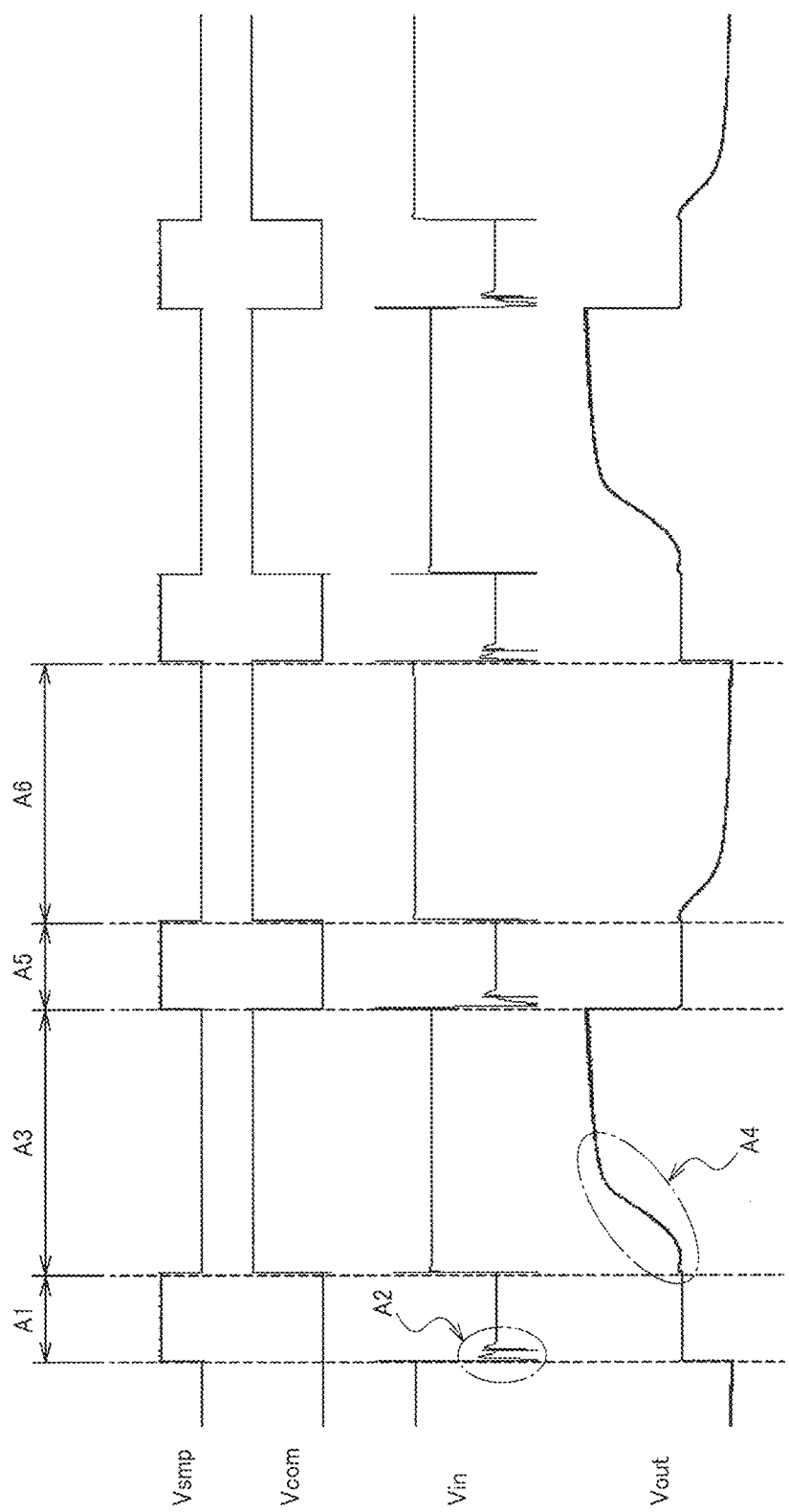
FIG. 8 is a diagram illustrating examples of waveforms generated by the comparison portion.

FIG. 8 is a specific waveform diagram in the comparison portion 27. Vcom indicates a control voltage for controlling the first switch S1, and Vsmp indicates a control voltage for controlling the second switch S2 and the third switch S3. A corresponding switch is turned on in a high level of Vcom and Vsmp, and a corresponding switch is turned off in a low level thereof. Vin indicates an input voltage (a voltage of the input terminal Nin) of the chopper circuit, and Vout indicates an output voltage.

A1 in FIG. 8 is a period corresponding to the sample mode, and, in this period, Vsmp has a high level, and Vcom has a low level, and thus the switch S1 is set to be turned off, and the switches S2 and S3 are set to be turned on. In this state, the temperature detection voltage VTD is input so that electric charge is gradually accumulated in the capacitor C, and the input voltage Vin becomes a voltage corresponding to VTD and Vc in a stable state. As can be seen from A2 in FIG. 8, since the capacitor C is not immediately charged, if a period of the sample mode is excessively short, the voltage Vc does not have a value corresponding to the temperature detection voltage VTD, and thus accuracy is reduced.

A3 in FIG. 8 is a period corresponding to the comparator mode, and, in this period, Vcom has a high level, and the Vsmp has a low level, and thus the switch S1 is set to be turned on, and the switches S2 and S3 are set to be turned off. In this state, the input voltage Vin becomes the D/A conversion voltage VDAC. In the example illustrated in FIG. 8, since D/A conversion voltage VDAC is lower than the temperature detection voltage VTD, the output voltage Vout gradually increases, and becomes the high potential side power source voltage in a stable state.

In a case where the output voltage Vout is determined as being the high potential side power source voltage (or a voltage close thereto), the processing portion 23 performs up determination that the temperature detection voltage VTD is higher than the D/A conversion voltage VDAC.

As can be seen from A4 in FIG. 8, since the output voltage Vout does not immediately change to the high potential side power source voltage, if a period of the comparator mode is excessively short, the output voltage Vout does not have a value corresponding to a relationship between the temperature detection voltage VTD and the D/A conversion voltage VDAC, and thus accuracy is reduced. For example, unless a period having a length in which the output voltage Vout changes to the extent of being clearly differentiated from the output voltage Vout in a case of VDAC>VTD (in a case of A6 which will be described later) is provided, the determination accuracy is reduced. As can be seen from comparison between A2 and A4 in FIG. 8, the time required for a circuit state to be stabilized in the comparator mode is longer than in the sample mode. Thus, a period set in the comparator mode is preferably longer than a period set in the sample mode.

In the technique of the present embodiment, a comparison process is performed on the temperature detection voltage VTD at a predetermined timing by using at least two D/A conversion voltages VDAC. The periods A1 and A3 correspond to a comparison process using the first D/A conversion voltage VDAC. After the period A3 is finished, a comparison process is performed by using the temperature detection voltage VTD and the second D/A conversion voltage VDAC. The second comparison process corresponds to the periods A5 and A6.

A5 is a period of the sample mode in which electric charge corresponding to the temperature detection voltage VTD is accumulated in the same manner as the period A1. The same temperature detection voltage VTD is treated in the periods A1 and A5, and, thus, ideally, the charging voltage Vc of the capacitor C is also maintained to be constant in the comparator mode. Therefore, the sample mode in the period A5 may be unnecessary, and thus the period A5 may be actually omitted. However, turning-on and turning-off of the analog switches (S1 to S3) are performed during switching between the sample mode and the comparator mode, and thus electric charge leakage may occur. In the example illustrated in FIG. 8, a probability of the electric charge leakage is taken into consideration, and the period A5 in which an operation is performed in the sample mode again is also provided during the second comparison process.

In the same manner as in the period A3, also in a period A6, Vcom has a high level, Vsmp has a low level, and the D/A conversion voltage VDAC is input. However, the input D/A conversion voltage VDAC is a voltage obtained by performing D/A conversion on digital data (a value obtained by adding 1LSB as will be described later in the normal operation mode) which is different from that in the period A3, and thus a value of the input voltage Vin differs in the periods A3 and A6.

In the example illustrated in FIG. 8, since D/A conversion voltage VDAC is higher than the temperature detection voltage VTD in the period A6, the output voltage Vout gradually decreases, and becomes the low potential side power source voltage in a stable state. In a case where the output voltage Vout is determined as being the low potential side power source voltage (or a voltage close thereto), the processing portion 23 performs down determination that the temperature detection voltage VTD is lower than the D/A conversion voltage VDAC.

The processing portion 23 may determine a value of the output temperature detection data DTD according to a combination of the up determination and the down determination. A specific digital value used for generation of the D/A conversion voltage VDAC or a specific technique of determining the temperature detection data DTD will be described later with respect to each of the normal operation mode and the high speed mode.

3.2 Normal Operation Mode

The normal operation mode is a technique for minimizing a defect caused by a rapid change in A/D conversion result data, for example, a defect caused by frequency hopping. First, with reference to FIG. 9, a description will be made of a communication error in a global positioning system (GPS) caused by frequency hopping.

Figure 9:
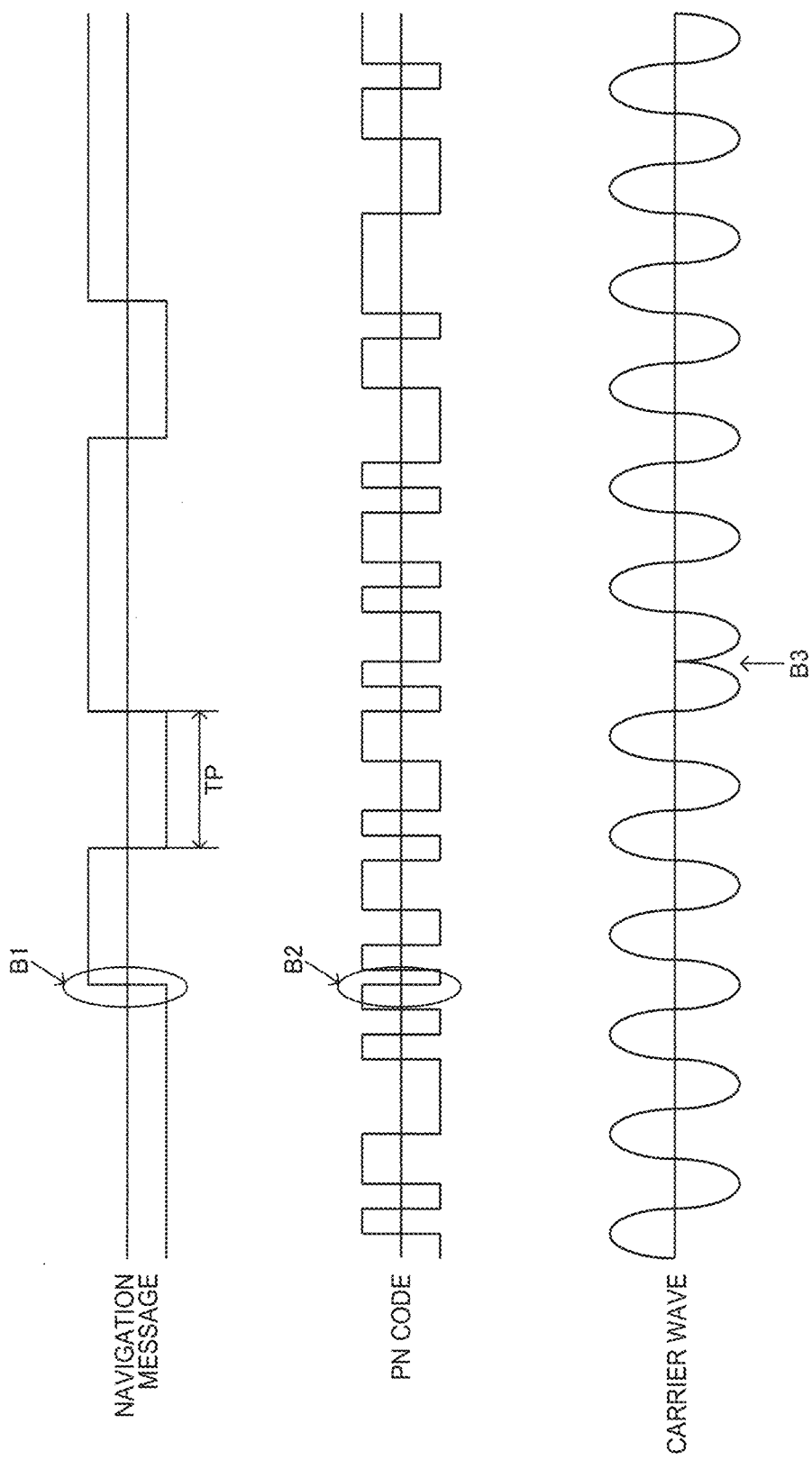
FIG. 9 is a diagram for explaining a communication error caused by a frequency drift.

A GPS satellite causes information regarding a satellite orbit or time to be included in a navigation message illustrated in FIG. 9, and transmits the information as a GPS satellite signal at a data rate of 50 bps. Thus, a length of 1 bit is 20 msec (20 cycles of a PN code). A single navigation message is formed of a single master frame, and the single master frame is formed of 25 frames each including 1500 bits.

As illustrated in FIG. 9, the GPS satellite signal is modulated by using a BPSK modulation method according to a bit value of the navigation message. Specifically, the navigation message undergoes BPSK modulation by being multiplied by a PN code (pseudo-random code) so as to spread a spectrum, and by multiplying a signal whose spectrum is spread by a carrier wave (1575.42 MHz). FIG. 9 illustrates a PN code corresponding to a B1 portion of the navigation message, and illustrates a carrier wave corresponding to a B2 portion of the PN code. A phase of the carrier wave is inverted as indicated by B3 at a timing at which a logic level of the PN code changes. A period of a single wavelength of the carrier wave is about 0.635 ns. A GPS receiver receives a carrier wave of the navigation message modulated according to the BPSK modulation method, and performs a demodulation process on the received signal of the carrier wave so as to acquire the navigation message.

When the demodulation process on the received signal is performed, a determination error occurs in the demodulation process unless a residual frequency from the frequency (1575.42 MHz) of the carrier wave is included in 4 Hz/20 msec. In other words, a communication error due to frequency hopping occurs unless a residual frequency from the frequency of the carrier wave is included in 4 Hz in TP=20 msec which is a period (a cycle of the GPS navigation message) of 1 bit length of the GPS navigation message.

Since a ratio of 4 Hz to 1575.42 MHz which is the frequency of the carrier wave is about several ppb, the allowable drift frequency FD as illustrated in FIGS. 1B and 1C is also about several ppb.

For example, the GPS receiver sets a frequency of the carrier wave in the demodulation process on the basis of an oscillation signal generated by the circuit device (oscillator) of the present embodiment. Thus, a drift of an oscillation frequency of the oscillation signal is required to be included in ±FD in the period TP=20 msec. In the above-described way, it is possible to prevent the occurrence of a determination error in a demodulation process on a received signal of a GPS satellite signal, and also to prevent the occurrence of a communication error (reception error).

However, in a digital type oscillator such as a DTCXO of the related art, a process in which a frequency drift is restricted to ±FD (about several ppb) in the period TP (20 msec) is not performed. Thus, there is a problem in that a communication error caused by a determination error in a demodulation process occurs due to frequency hopping as illustrated in FIG. 1C.

In contrast, in the normal operation mode, a change in the temperature detection data DTD at output timings adjacent to each other is restricted to k×LSB or less, and thus frequency hopping or the like can be minimized.

Figure 10:
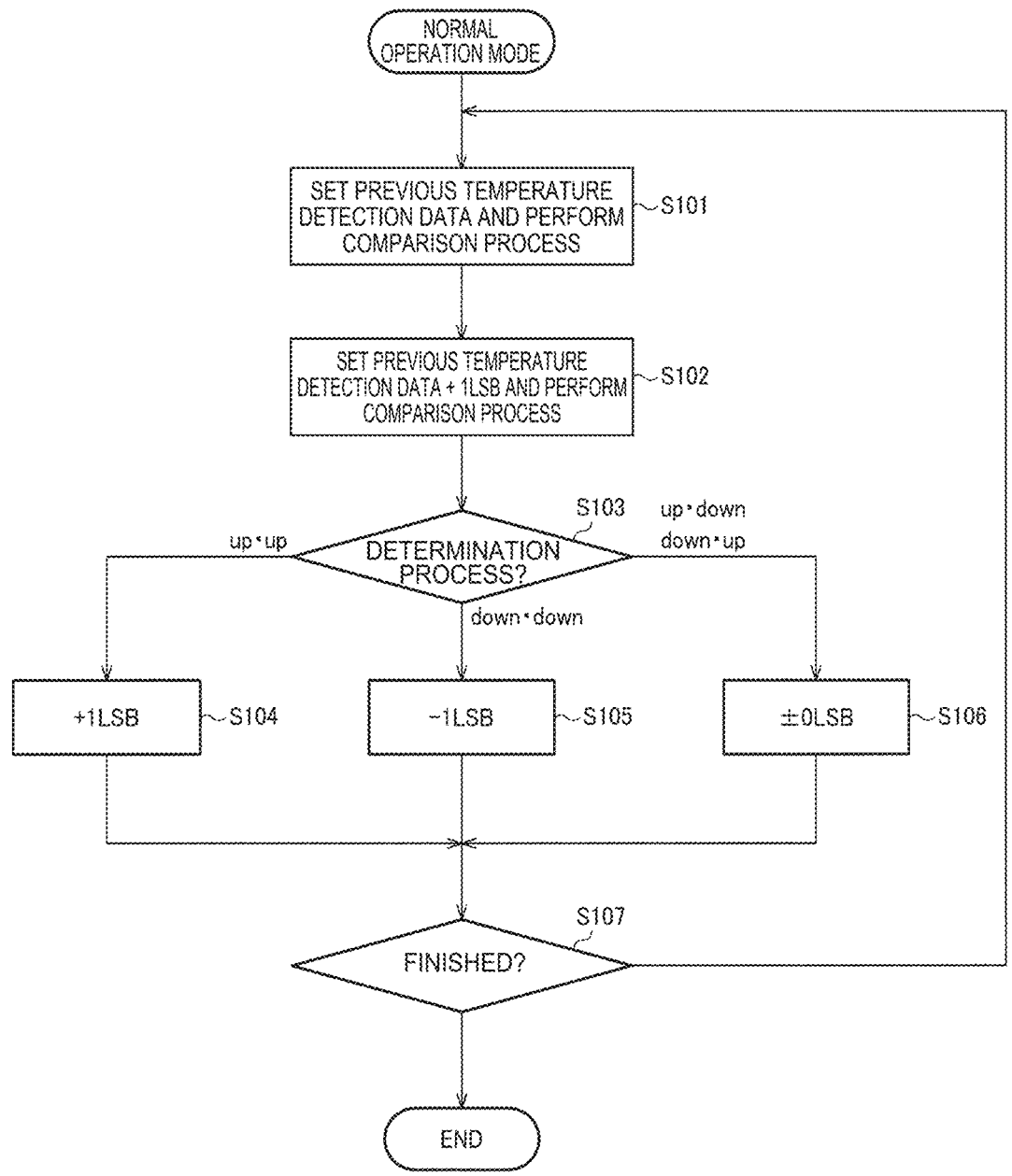
FIG. 10 is a flowchart for explaining a process in a normal operation mode.

FIG. 10 is a flowchart for explaining a process in the normal operation mode. Here, first, the description will be made by exemplifying a case of k=1. If the normal operation mode is started, first, a code of the previous temperature detection data DTD is D/A-converted by the D/A converter 26 so as to be used as the D/A conversion voltage VDAC (step S101). As described above with reference to FIG. 8, a comparison process with the temperature detection voltage VTD is performed in the sample mode (for example, A1) and the comparator mode (for example, A3), and a result of an up determination or a down determination is acquired.

Next, 1LSB is added to a value in the resister portion, that is, a value of the previous temperature detection data DTD, and D/A conversion is performed on data as a result of the addition in the D/A converter 26, and an obtained result is used as the D/A conversion voltage VDAC (step S102). As described above with reference to FIG. 8, a comparison process with the temperature detection voltage VTD is performed in the sample mode (for example, A5) and the comparator mode (for example, A6), and a result of an up determination or a down determination is acquired.

Through steps S101 and S102, the comparison portion 27 outputs a first comparison result which is a comparison result between the D/A conversion voltage VDAC obtained by converting the temperature detection data DTD (previous final result data) at the previous output timing in the D/A converter 26 and the temperature detection voltage VTD, and outputs a second comparison result which is a comparison result between the D/A conversion voltage VDAC obtained by converting second data in which 1LSB is added to the previous final result data in the D/A converter 26 and the temperature detection voltage VTD.

The processing portion 23 performs a determination process of determining the present temperature detection data DTD on the basis of the two comparison process results (step S103).

First, in a case where it is determined that the temperature detection voltage VTD is higher than the D/A conversion voltage VDAC according to a determination process based on the first comparison result, that is, in a case where an up determination is performed, and a result of a determination process based on the second comparison result is also an up determination, the present final result data is determined to be a value obtained by adding 1LSB to the second data, that is, the previous temperature detection data DTD (step S104).

The case where both of the two comparison processes are an up determination corresponds to a state in which the present temperature is sufficiently higher than a temperature at the previous output timing. Thus, the present temperature detection data DTD may be larger than the previous temperature detection data DTD, and, here, since a change width is 1LSB or less, and thus a value obtained by adding only 1LSB may be output.

In a case where it is determined that the temperature detection voltage VTD is lower than the D/A conversion voltage VDAC according to a determination process based on the first comparison result, that is, in a case where a down determination is performed, and a result of a determination process based on the second comparison result is also a down determination, the present final result data is determined to be data obtained by subtracting 1LSB from the previous final detection data (step S105).

The case where both of the two comparison processes are a down determination corresponds to a state in which the present temperature is sufficiently lower than a temperature at the previous output timing. Thus, the present temperature detection data DTD may be smaller than the previous temperature detection data DTD, and, here, since a change width is 1LSB or less, and thus a value obtained by subtracting only 1LSB may be output.

A case where a result of a determination process based on the first comparison result is an up determination, and a result of a determination process based on the second comparison result is a down determination corresponds to a state in which a temperature change is not great. Thus, the present temperature detection data DTD is maintained to have a value of the previous temperature detection data DTD (step S106).

A case where a result of a determination process based on the first comparison result is a down determination, and a result of a determination process based on the second comparison result is an up determination corresponds to a state which does not normally occur. This is because the temperature detection voltage VTD in this case is lower than a predetermined voltage, and is higher than a voltage higher than the predetermined voltage, and such a voltage value does not exist. Since there is a concern that at least one of the first and second comparison processes may not be appropriately performed in this state, it is not preferable to change a value of the temperature detection data DTD which is output through such an inappropriate determination. Therefore, in the present embodiment, in a case where a result of a determination process based on the first comparison result is a down determination, and a result of a determination process based on the second comparison result is an up determination, the present temperature detection data DTD is maintained to have a value of the previous temperature detection data DTD (step S106).

To summarize, in a case where one of a result of a determination process based on the first comparison result and a result of a determination process based on the second comparison result is an up determination, and the other thereof is a down determination, the processing portion 23 may determine the present final result data (temperature detection data DTD) to be the previous final result data.

In the above-described way, it is possible to output the temperature detection data DTD through two comparison processes, and thus to suppress a rapid change in A/D conversion so as to perform an efficient process.

Two comparison processes are performed since k=1 here, but, processing can also be similarly simplified in a case where k is 2 or greater. In other words, a value of the previous temperature detection data DTD which has already been obtained can be used as it is for bits on the MSB side exceeding ±k×LSB, and thus there is an effect of being capable of omitting a comparison process for determining the bits.

For example, the comparison portion 27 outputs a first comparison result through comparison between the D/A conversion voltage VDAC obtained by converting the previous final result data corresponding to the temperature detection data DTD at the previous output timing in the D/A converter 26 and the temperature detection voltage VTD, and outputs a second comparison result through comparison between the D/A conversion voltage VDAC obtained by converting data in which the previous final result data is updated in the range of k×LSB or less in the D/A converter 26 and the temperature detection voltage VTD. The processing portion 23 may perform a determination process based on the first comparison result and the second comparison result, update the previous final result data in the range of k×LSB or less on the basis of the determination processes, and perform an update process of determining the updated data to be the present final result data.

It is determined whether or not the normal operation mode is finished, for example, a disable signal is input (step S107) after any one of steps S104 to S106 is performed, and, in a case where the disable signal is input in step S107, the normal operation mode is finished, and in a case where the disable signal is not input, the flow returns to step S101 so that the process is continuously performed.

Figure 11A:
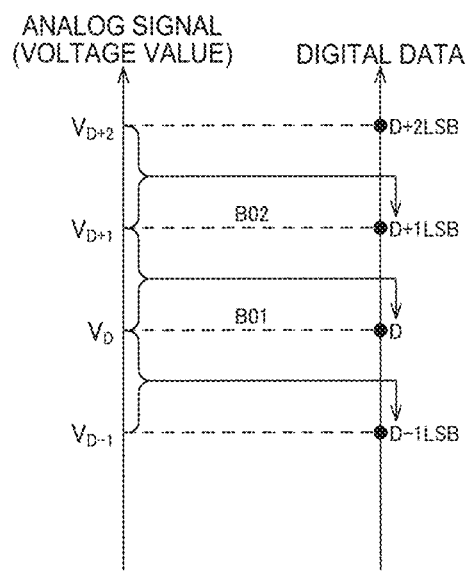
FIGS. 11A and 11B illustrate examples of a relationship between an analog signal and digital data.

In the above description, a relationship illustrated in FIG. 11A is assumed as a relationship between predetermined digital data and an analog signal (D/A conversion voltage) corresponding to the digital data. Specifically, in a case where a predetermined value D, D+1LSB, and D−1LSB are set as digital data, and analog signals (voltage values) corresponding to the respective items of the digital data are set to $V_D$, $V_{D+1}$, and $V_{D-1}$, the relationship is that digital data corresponding to a case where a voltage value is $V_{D-1}$ to $V_D$ is D−1LSB, digital data corresponding to a case where a voltage value is $V_D$ to $V_{D+1}$ is D, and digital data corresponding to a case where a voltage value is $V_{D+1}$ to $V_{D+2}$ is D+1LSB. In this example, boundaries between D and D±1LSB as output digital data are BO1 and BO2, that is, $V_D$ and $V_{D+1}$. Thus, as described above in steps S101 and S102, if the previous temperature detection data DTD and a value obtained by adding 1LSB thereto are used as data (codes) which is input to the D/A converter 26, it is possible to appropriately determine whether, as the present temperature detection data DTD, the previous value is used without change or a value obtained by adding ±1LSB thereto is used.

Figure 11B:
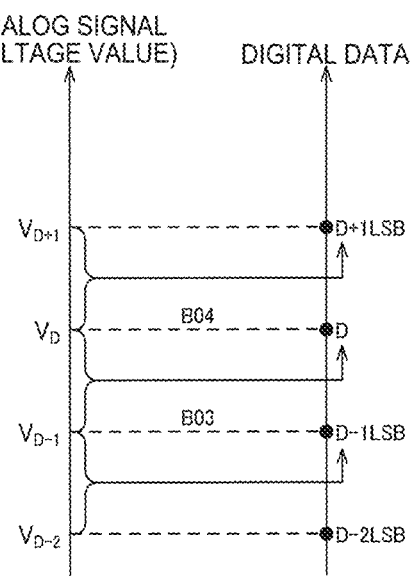

However, a relationship between an analog signal and digital data is not limited to the relationship illustrated in FIG. 11A, and may be a relationship illustrated in FIG. 11B, for example. In FIG. 11B, digital data corresponding to a case where a voltage value is $V_{D-2}$ to $V_{D-1}$ is D−1LSB, digital data corresponding to a case where a voltage value is $V_{D-1}$ to $V_D$ is D, and digital data corresponding to a case where a voltage value is $V_D$ to $V_{D+1}$ is D+1LSB. In the example illustrated in FIG. 11B, boundaries between D and D±1LSB as output digital data are BO3 and BO4, that is, $V_{D-1}$ and $V_D$. Thus, the previous temperature detection data DTD and a value obtained by subtracting 1LSB therefrom may be used as data (codes) which is input to the D/A converter 26.

In this case, the comparison portion 27 may output a first comparison result through comparison between the D/A conversion voltage VDAC obtained by converting the previous final result data corresponding to the temperature detection data DTD at the previous output timing in the D/A converter 26 and the temperature detection voltage VTD, and outputs a second comparison result through comparison between the D/A conversion voltage VDAC obtained by converting second data in which 1LSB is subtracted from the previous final result data in the D/A converter 26 and the temperature detection voltage VTD.

Also in this case, a determination in the processing portion 23 may be performed in the same manner. In a case where a result of a determination process based on the first comparison result is an up determination, and a result of a determination process based on the second comparison result is also an up determination, the processing portion 23 determines data obtained by adding 1LSB to the previous final result data to be the present final result data. In a case where a result of a determination process based on the first comparison result is a down determination, and a result of a determination process based on the second comparison result is also a down determination, the processing portion 23 determines the second data (the data obtained by subtracting 1LSB) to be the present final result data.

In a case where one of a result of a determination process based on the first comparison result and a result of a determination process based on the second comparison result is an up determination, and the other result is a down determination, the processing portion 23 may determine the previous final result data to be the present final result data (temperature detection data DTD).

In FIG. 7A, two voltages such as the D/A conversion voltage VDAC and the temperature detection voltage VTD are input to the comparison portion 27, but the present embodiment is not limited thereto. As described above, in the normal operation mode, voltages as a comparison target with the temperature detection voltage VTD are two voltages including a first D/A conversion voltage VDACA obtained by D/A-converting the previous temperature detection data DTD and a second D/A conversion voltage VDACB obtained by D/A-converting data in which 1LSB is added (subtracted) to (from) the previous temperature detection data DTD. In other words, since the voltages VDACA and VDACB are preferably input to the comparison portion 27, as illustrated in FIGS. 7A to 7C, a period in which the voltage VDACA is input and a period in which the voltage VDACB is input may be provided by using a single input path in a time division manner, and a path for inputting the voltage VDACA and a path for inputting the voltage VDACB may be provided separately from each other.

Figure 12:
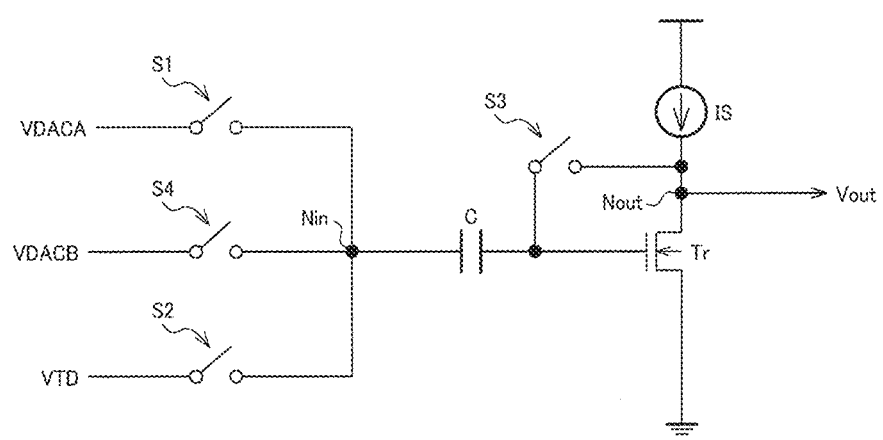
FIG. 12 illustrates another configuration example of the comparison portion.

FIG. 12 illustrates a configuration example of the comparison portion 27 in a case where paths are provided separately from each other. As illustrated in FIG. 12, the comparison portion 27 includes a fourth switch S4 provided between the D/A converter 26 and one end of the capacitor C, and the second D/A conversion voltage VDACB is input to the switch S4 from the D/A converter 26. In this example, in the comparator mode (A3 in FIG. 8) in which the voltage VDACA and the voltage VTD are compared with each other, the switch S1 may be set to be turned on, and the switches S2 to S4 may be set to be turned off. In the comparator mode (A5 in FIG. 8) in which the voltage VDACB and the voltage VTD are compared with each other, the switches S1 to S3 may be set to be turned off, and the switch S4 may be set to be turned on.

3.3 High Speed Mode

Next, the high speed mode will be described as a specific example of the first A/D conversion method. The high speed mode is a technique in which there is a difference between determination periods on the MSB side and the LSB side as described above, and, thus, first, a specific determination period will be described.

As described above, since a bit on the MSB side corresponds to a great value, a value (a voltage value as an analog signal in a case where D/A conversion is performed) greatly changes according to whether the bit is 0 or 1. Thus, a probability of the occurrence of a determination error in a comparison process performed by the comparison portion 27 is lower on the MSB side than on the LSB side. However, a probability of the occurrence of a determination error still remains, and, in the present embodiment, a determination period for the MSB side is short, and thus a probability of the occurrence of a determination error increases. As described above, the MSB side has high contribution to a value, and thus has considerable influence on the value in a case where a determination error occurs.

In the present embodiment, by taking into consideration this fact, a determination result of the MSB side is corrected on the basis of a determination result of the LSB side. A determination period for the LSB side is relatively long, and thus the determination accuracy can also be increased. In other words, a result of the MSB side whose determination accuracy is relatively low is corrected on the basis of a result of the LSB side whose determination accuracy is high, and thus it is possible to increase the accuracy of the temperature detection data DTD. Therefore, hereinafter, this correction technique will be described as well.

The high speed mode is a technique similar to a successive comparison mode, and allows a value of the temperature detection data DTD to be determined by one bit from the MSB side. However, as will be described later, in a case where correction of a result of the MSB side using a result of the LSB side is performed through carry or borrow from a low-order bit, a possibility of carry and borrow has to be taken into consideration for all bits in the process by one bit, and thus the number of comparison processes increases. For example, in a case where A/D conversion is performed in 15 bits, the presence or absence of carry and borrow has to be determined every time in processes of 14 bits excluding the most significant bit. In this case, even if the time for a single comparison process is shortened, there is a concern that the effect of achieving a high speed may be reduced.

Therefore, in order to efficiently achieve high speed while performing carry or borrow from a low-order bit, it is preferable to reduce the number of determining the occurrence of carry (borrow). For example, in a case where a process is performed with 2 bits as one unit, 15 bits may be partitioned into 8 bit ranges as will be described later, and a determination of carry or borrow may be performed in 7 bit ranges excluding the most significant 2 bits.

Figures 13A, 13B:
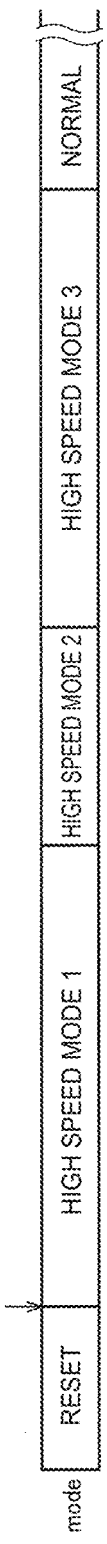
FIGS. 13A and 13B illustrate examples of setting a determination period in a high speed mode.

Therefore, hereinafter, as an example, a description will be made of a case where A/D conversion result data is partitioned into a plurality of bit ranges with a predetermined bit width, and a bit value is determined from the MSB side to the LSB side in each bit range. Particularly, in an example which will be described later, the predetermined bit width is 2 bits. Of course, the predetermined bit width here may be 3 or more bits, and, as described above, a process may be performed in the 1 bit unit. In FIG. 13A or 13B, as can be seen from the fact that the least significant bit has one bit as the unit, all bit ranges do not have to be set with the same bit width, and, for example, there may be a modification example in which different bit widths are set on the MSB side and the LSB side.

3.3.1 Difference Between Determination Periods on MSB Side and LSB Side

FIGS. 13A and 13B illustrate setting examples of determination periods in the high speed mode. A transverse axis in FIG. 13A expresses time. An upper part in FIG. 13A illustrates a mode, and, here, three modes (mode 1 to mode 3) having different determination period lengths are set in the high speed mode. A lower part in FIG. 13A illustrates a determination target bit in A/D conversion result data of 15 bits. D[x:y] indicates data having a width of x−y+1 from a y-th bit to an x-th bit when counted from the least significant bit (LSB) in the A/D conversion result data. Since the least significant bit is D [0], for example, D[14:13] indicates 2 bits on the MSB side.

As can be seen from FIG. 13A, five partitions including D[14:13] to D[6:5] are set to the mode 1 in which a determination period is shortest (highest speed). In FIG. 13A, determination period lengths are different in D[14:13] and other partitions, and this occurs from the viewpoint that carry and borrow are not taken into consideration in the most significant bit, but there is no difference in the time required for one comparison process.

D[4:3] is set to the mode 2 in which a determination period is longer than the mode 1, and D[2:1] is set to the mode 3 in which a determination period is further longer. A determination period which is longer than that of the mode 3 is set for D[0] which is the least significant bit. As will be described later in detail, for example, a determination of D[0] may be performed through the same process as in the above-described normal operation mode.

FIG. 13B illustrates examples of setting specific determination periods. In the example illustrated in FIG. 13B, a period corresponding to two clocks is set in the mode 1 for the highest speed when converted into clocks used for A/D conversion, for both of the sample mode and the comparator mode. A clock frequency may be variously set, and, is, for example, 128 kHz.

With respect to D[14:13], two comparison processes may be performed in order to determine data of the 2 bits as will be described later by using step S201 and step S203 (or step S204) in FIG. 14A. In other words, D[14:13] requires a period corresponding to two clocks for each of the first sample mode, the first comparator mode, the second sample mode, and the second comparator mode, and thus a period corresponding to a total of eight clocks is set as a determination period. If a clock frequency is 128 kHz, a determination period of D[14:13] is 62.5 μsec.

With respect to four partitions including D[12:11] to D[6:5], three comparison processes are required to be performed in order to determine data of the 2 bits and the presence or absence of carry or borrow as will be described later by using step S206, step S208, and step S209 (or step S210 and step S211) in FIG. 14A. Therefore, each of the sample mode and the comparator mode is performed three times, and each period corresponds to two clocks, and thus a period corresponding to a total of twelve clocks is set as a determination period. If a clock frequency is 128 kHz, a determination period of each partition of D[12:11] to D[6:5] is 93.75 μsec.

With respect to D[4:3], a relatively long determination period is set in order to increase the determination accuracy compared with the MSB side. In this case, as described with reference to the waveform diagram of FIG. 8, contribution to the accuracy is higher in a case where a period of the comparator mode is long than in a case where a period of the sample mode is long. Therefore, in the example illustrated in FIG. 13B, in the mode 2, a period corresponding to two clocks is allocated to the sample mode, and a period corresponding to six clocks is allocated to the comparator mode. Also with respect to D[4:3], three comparison processes are performed, and thus a period corresponding to a total of twenty-four (=(2+6)×3) clocks is set as a determination period. If a clock frequency is 128 kHz, a determination period of D[4:3] is 187.5 μsec.

A longer determination period is set for D [2:1]. In the example illustrated in FIG. 13B, in the mode 3, a period corresponding to twelve clocks is allocated to the comparator mode. As described above with reference to FIG. 8, a long sample mode can be expected to increase the accuracy, and, thus, here, a period of the sample mode expands to four clocks. Also with respect to D[2:1], three comparison processes are performed, and thus a period corresponding to a total of forty-eight (=(4+12)×3) clocks is set as a determination period. If a clock frequency is 128 kHz, a determination period of D[2:1] is 375 μsec.

A further longer determination period is set for D[0]. In the example illustrated in FIG. 13B, a period corresponding to twenty-four clocks is allocated to the comparator mode, and a period corresponding to eight clocks is allocated to the sample mode. As will be described later, the same process as in the normal operation mode may be performed on D[0]. In this case, two comparison processes are performed, and thus a period corresponding to a total of sixty-four (=(8+24)×2) clocks is set as a determination period. If a clock frequency is 128 kHz, a determination period of D[0] is 500 μsec.

In the description of the normal operation mode, a specific determination period has not been described, but, as an example, in the same manner as for D[0], a period corresponding to twenty-four clocks may be allocated to the comparator mode, and a period corresponding to eight clocks may be allocated to the sample mode. Of course, the processing content or a determination period of D[0] is not necessarily be the same as in the normal operation mode, and may be variously modified.

As will be described later with reference to a flowchart of FIG. 14A, the high speed mode may be a mode in which D[14:1] is determined, and D[0] in the high seed mode is not determined. In this case, the normal operation mode is performed by using, as an initial value, data of 15 bits formed of D[14:1] determined in the high speed mode and D[0] in an initial state (0 in an example which will be described later). There is a probability that a difference from an actual temperature may occur in the least significant bit or bits in the vicinity thereof, but, the difference is sufficiently small, and a great problem does not occur in a process of brining values close to each other by k×LSB in the normal operation mode.

As can be seen from integration of conversion time in FIG. 13B, A/D conversion with 15-bit accuracy can be performed, for example, within 1.5 msec, and thus the request for being within 2 msec can be satisfied.

FIGS. 13A and 13B illustrate examples of setting determination periods in the high speed mode, and various modification examples may occur. For example, the number of clocks allocated to the sample mode and the comparator mode may be set to values which are different from those in FIG. 13B, and, as described above, the second and third sample modes may be omitted. Alternatively, in a case where a determination result of the MSB side is corrected on the basis of a determination result of the LSB side, for example, carry or borrow is not taken into consideration, the number of comparison processes can be reduced for each partition of D[12:11] to D[2:1], and thus it is possible to realize a higher speed. Here, a description has been made of a setting example in which determination periods are changed in four stages such as the modes 1 to 3 of the high speed mode and the normal mode, but, since determination periods are preferably different from each other on at least the MSB side and the LSB side, lengths of determination periods may be changed in two stages or three stages, and may be changed in five or more stages.

3.3.2 Correction of Determination Result of MSB Side Based on Determination Result of LSB Side FIG. 14A is a flowchart illustrating a flow of specific processes in the high speed mode. The high speed mode may be roughly classified into a portion (steps S201 to S205) for determining D[14:13] and a portion (steps S206 to S213) for determining D[12:1]. A difference between both of the two portions is the presence or absence of carry and borrow with respect to the MSB side. Hereinafter, details thereof will be described.

When the high speed mode is started, an intermediate value is set as A/D conversion result data. For example, data such as "100000000000000" is set. First, in a determination of D[14:13], data in which "10" is set as the 2 bits is D/A-converted so as to generate the D/A conversion voltage VDAC, a comparison process with the temperature detection voltage VTD is performed (step S201), and the processing portion 23 performs a determination process based on a result thereof (step S202). Values which have already been determined or initial values may be set as other 13 bits which are not determination targets. In the case of D[14:13], D[12:0] has not been determined, and initial values are all 0, and thus data in a case where "10" is set as D[14:13] becomes "100000000000000".

In step S202, in a case where it is determined that the voltage VTD is higher than the voltage VDAC, that is, an up determination is performed, data in which "11" is set as D[14:13] is D/A-converted so as to generate the D/A conversion voltage VDAC, and a comparison process with the temperature detection voltage VTD is performed (step S203). On the other hand, in step S202, in a case where it is determined that the voltage VTD is lower than the voltage VDAC, that is, a down determination is performed, data in which "01" is set as D[14:13] is D/A-converted so as to generate the D/A conversion voltage VDAC, and a comparison process with the temperature detection voltage VTD is performed (step S204).

The processing portion 23 determines a result in step S203 or S204 (step S205). FIG. 14B is a diagram illustrating the specific determination content. In a case where an up determination is performed at "10", and an up determination is also performed at "11" (in a case where an up determination is also performed after transition to step S203), D[14:13] is set to "11". In a case where an up determination is performed at "10", and a down determination is performed at "11" (in a case where a down determination is performed after transition to step S203), D[14:13] is set to "10". In a case where a down determination is performed at "10", and an up determination is performed at "01" (in a case where an up determination is performed after transition to step S204), D[14:13] is set to "01". In a case where a down determination is performed at "10", and a down determination is also performed at "01" (in a case where a down determination is performed after transition to step S204), D[14:13] is set to "00".

The above-described process is the same as a general comparison process, and, particularly, carry and borrow may not be taken into consideration.

Next, transition to a determination process on a 2-bit LSB side occurs. First, data in which "10" is set as 2 bits of D[12:11] is D/A-converted so as to generate the D/A conversion voltage VDAC, a comparison process with the temperature detection voltage VTD is performed (step S206), and the processing portion 23 performs a determination process based on a result thereof (step S207). The values determined in step S205 are set as D[14:13], and initial values (here, "0s") are set as D[10:0]. For example, in a case where D[14:13]="11" is determined, data set in step S206 is "111000000000000".

In a case where an up determination is performed in step S207, data in which "11" is set as D[12:11] is D/A-converted so as to generate the D/A conversion voltage VDAC, and a comparison process with the temperature detection voltage VTD is performed (step S208). However, in a case where "11" is set, even if it is determined that the voltage VTD is higher than the voltage VDAC, as described in step S205, D[12:11] is only determined as being "11", and thus bits (here, D[14:13]) located further toward the MSB side cannot be corrected. Therefore, in order to take into consideration carry, a greater value than "11" is required to be set as D[12:11].

Specifically, data in which data in a state of carry occurring is set is D/A-converted so as to generate the D/A conversion voltage VDAC, and a comparison process with the temperature detection voltage VTD is performed (step S209). In this example, D[12:11] may be set to "00", and a value of D[13] may be increased by 1. For example, in a case where it is determined that D[14:13] is "01", D[14:11] is set to "1000". In other words, D[14:11] is set to "0111" in step S208, and "1000" which is greater than the value is set in step S209.

In a case where a down determination is performed in step S207, data in which "01" is set as D[12:11] is D/A-converted so as to generate the D/A conversion voltage VDAC, and a comparison process with the temperature detection voltage VTD is performed (step S210). However, in a case where "01" is set, even if it is determined that the voltage VTD is lower than the voltage VDAC, as described in step S205, D[12:11] is only determined as being "00", and thus correction (specifically, correction for reducing values) of bits located further toward the MSB side cannot be performed. Therefore, in order to take into consideration borrow, a smaller value than "01" is required to be set as D[12:11]. Specifically, data in which "00" is set as D[12:11] is D/A- converted so as to generate the D/A conversion voltage VDAC, and a comparison process with the temperature detection voltage VTD is performed (step S211).

The processing portion 23 performs a determination based on comparison results in steps S208 and S209 or steps S210 and S211. FIG. 14C is a diagram illustrating the specific determination content. First, a description will be made of a case where an up determination is performed in step S207. In this case, comparison processes are performed in steps S208 and S209, and an up determination and a down determination may be performed in each step, and thus a total of four patterns may be present.

In a case where an up determination is performed in both of steps S208 and S209, it can be seen that the temperature detection voltage VTD is high to the extent that carry is necessary. Therefore, values of 2 bits which are determination targets are determined to be "00", and 1 is added to one bit on the MSB side. In a case where a down determination is performed in both of steps S208 and S209, it can be seen that the temperature detection voltage VTD is located between a case where "10" is set and a case where "11" is set, and thus values of 2 bits which are determination targets are determined to be "10".

In a case where an up determination is performed in step S208 and a down determination is performed in step S209, it can be seen that the temperature detection voltage VTD is located between a case where "11" is set and a case where carry occurs, and thus values of 2 bits which are determination targets are determined to be "11".

In a case where a down determination is performed in step S208, and an up determination is performed in step S209, it can be seen that this case corresponds to an error state which does not normally occur. There may be various processes in a case of the error state, but, here, values such as "11" are set. In other words, in steps S208 and S209, values are determined by taking into consideration three patterns such as (1) a case where an up determination is performed in both of the two steps, (2) a case where a down determination is performed in both of the two steps, and (3) a case where an up determination is performed in one of the two steps, and a down determination is performed in the other step.

Next, a description will be made of a case where a down determination is performed in step S207. In this case, comparison processes are performed in steps S210 and S211, and an up determination and a down determination may be performed in each step, and thus a total of four patterns may be present.

In a case where an up determination is performed in both of steps S210 and S211, it can be seen that the temperature detection voltage VTD is located between a case where "01" is set and a case where "10" is set, and thus values of 2 bits which are determination targets are determined to be "01". In a case where a down determination is performed in both of steps S210 and S211, it can be seen that the temperature detection voltage VTD is low to the extent that borrow is necessary. Therefore, values of 2 bits which are determination targets are determined to be "11", and 1 is subtracted from one bit on the MSB side. For example, in a case where D[14:13]="10", and it is determined that borrow is necessary in D[12:11], D[14:11] may be determined to be "0111".

In a case where a down determination is performed in step S210, and an up determination is performed in step S211, it can be seen that the temperature detection voltage VTD is located between a case where "00" is set and a case where "01" is set, and thus values of 2 bits which are determination targets are determined to be "00".

In a case where an up determination is performed in step S210, and a down determination is performed in step S211, it can be seen that this case corresponds to an error state which does not normally occur. There may be various processes in a case of the error state, but, here, values such as "00" are set. In other words, in steps S210 and S211, values are determined by taking into consideration three patterns such as (1) a case where an up determination is performed in both of the two steps, (2) a case where a down determination is performed in both of the two steps, and (3) a case where an up determination is performed in one of the two steps, and a down determination is performed in the other step.

FIG. 15 illustrates examples of determining specific numerical values in the high speed mode. A longitudinal axis expresses time, and a process is performed from the top of a table to the bottom thereof. DB[14:0] indicates D/A conversion target data (data which is a base of the D/A conversion voltage VDAC) in the D/A converter 26, and DO[14:0] indicates A/D conversion result data with 15-bit accuracy as an output in the high speed mode. A comparison process and a determination process are performed while variously changing values of the data DB, and the data DO is updated on the basis of results thereof. The data DO corresponds to A/D conversion result data at a timing at which a process up to a bit on the LSB side is completed. As described above, actual determination periods are different from each other on the MSB side and the LSB side, but, in FIG. 15, for convenience, no difference is provided in lengths on the longitudinal axis. In the data DB and DO, a shaded portion indicates a bit whose value is updated. As will be described later by using C8, in a case where carry or borrow occurs, a bit which is not a processing target may be an update target.

First, 2 bits on the MSB side are set to "10" (C1 which corresponds to step S201), and a determination process is performed. Since an up determination is performed here, the 2 bits are set to "11" next (C2 which corresponds to step S203), and a determination process is performed. Since an up determination is also performed here, DO[14:13] is determined to be "11" (C3), and transition to a determination of D[12:11] occurs.

D[12:11] is first set to "10" (C4 which corresponds to step S206), and a determination process is performed. Since a down determination is performed here, "01" and "00" are set (C5 and C6 which correspond to steps S210 and S211). In the example illustrated in FIG. 15, since an up determination is performed in both of C5 and C6, DO[12:11] is determined to be "01" (C7), and transition to a determination of D[10:9] occurs.

Hereinafter, a description will be simplified. With respect to D[10:9], an up determination is performed for "10", an up determination is performed for one of "11" and "100 (carry)", a down determination is performed for the other thereof, and thus DO [10:9] is determined to be "11". When "100" is set, carry occurs, and thus DB[12:11] becomes "10" (C8).

With respect to D[8:7], a down determination is performed for "10", a down determination is performed for both of "01" and "00", and borrow occurs. Specifically, DO[8:7] is determined to be "11", and D[10:9] determined to be "11" is subjected to subtraction, and thus D[10:9] is corrected to "10".

With respect to D[6:5], an up determination is performed for "10", an up determination is performed for both of "11" and "100 (carry)", and carry occurs. Specifically, DO [6:5] is determined to be "00", and D[8:7] determined to be "11"

is subjected to addition. In this case, carry spreads to the bits on the MSB side, and thus D[10:7] determined to be "1011" is corrected to "1100".

With respect to D[4:3], an up determination is performed for "10", a down determination is performed for both of "11" and "100 (carry)", and DO [4:3] is determined to be "10".

With respect to D[2:1], a down determination is performed for "10", an up determination is performed for one of "01" and "00", a down determination is performed for the other thereof, and thus DO[2:1] is determined to be "00".

Since the normal operation mode is similarly applied to D[0], a comparison process in a case where DO[14:0] determined hitherto is set and a comparison process in a case where a value obtained by adding 1LSB to DO[14:0] is set may be performed, and a value may be updated within a range of 1LSB or less. In this example, an initial value of D[0] is 0, and borrow occurs in a case where 1LSB is subtracted. An initial value may be set to 1 if carry is desired to occur.

Alternatively, a modification example may occur in which an operation is changed unlike the normal operation mode, first, "1" is set, "10 (carry)" is set in a case of an up determination, and "0" is set in a case of a down determination. In this example, carry occurs if an up determination is performed for both of the cases, and borrow occurs if a down determination is performed for both of the cases. In a case where an up determination is performed for "1", and a down determination is performed for "10", "1" may be determined, and in a case where a down determination is performed for "1", and an up determination is performed for "0", "0" may be determined.

4. Other Configuration Examples in Case of DTCXO

As described above with reference to FIG. 4, the circuit device according to the present embodiment may include the A/D conversion unit 20 provided with the D/A converter 26, the comparison portion 27, and the processing portion 23; the digital signal processing unit 50 which performs a temperature compensation process on an oscillation frequency on the basis of the temperature detection data DTD so as to output frequency control data of the oscillation frequency; and the oscillation signal generation circuit 140 which generates an oscillation signal having an oscillation frequency set by the frequency control data by using the frequency control data from the digital signal processing unit 50 and the resonator XTAL.

In this example, frequency hopping may be minimized by restricting a change in the temperature detection data DTD which is output from the A/D conversion unit 20 to k×LSB or less. However, since the frequency hopping is directly related to a change in an output from the oscillation signal generation circuit 140, a method of minimizing frequency hopping in other configurations related to the output may also be used.

Hereinafter, a specific method will be described, and then configuration examples of the digital signal processing unit 50 and the D/A conversion unit 80 realizing the method will be described. Configuration examples of the temperature sensor unit 10 or the oscillation circuit 150 used for a DTCXO will also be described.

Figure 16:
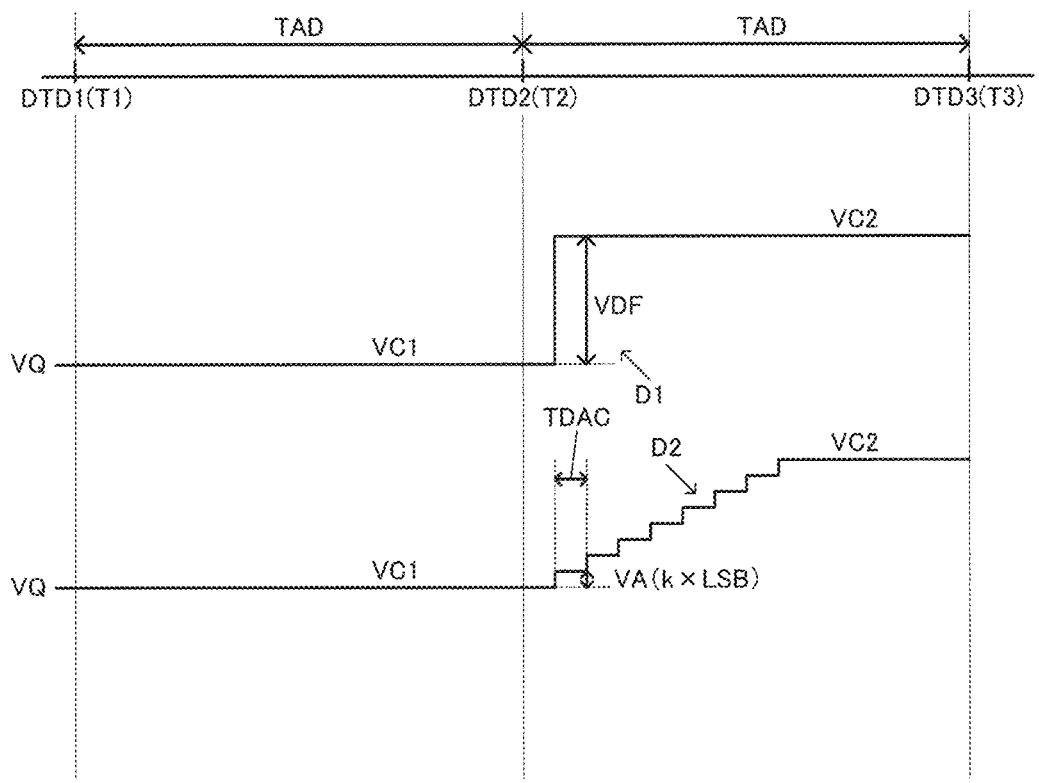
FIG. 16 is a diagram for explaining a technique of minimizing frequency hopping or the like by using configurations other than the A/D conversion unit.

4.1 Technique of Minimizing Frequency Hopping Using Configurations Other than A/D Conversion Unit In order to minimize frequency hopping, as illustrated in FIG. 16, in a case where a temperature changes from a first temperature T1 to a second temperature T2, the output voltage VQ which changes with a voltage width smaller than an absolute value of a difference voltage VDF between a first control voltage VC1 and a second control voltage VC2 may output from the D/A conversion unit 80 to the oscillation circuit 150.

An absolute value of the difference voltage VDF is, for example, |VC1−VC2|. In this case, VC1>VC2 may occur, and VC1<VC2 may occur. In a case where there is no temperature change, that is, VC1=VC2 (DTD1=DTD2), a change width of the output voltage VQ is naturally 0V, and thus the absolute value of the difference voltage VDF matches the change width of the output voltage VQ. In other words, this case is an exceptional case of the technique of the present embodiment.

For example, in a case where this technique is not employed, if a temperature changes from T1 to T2, the output voltage VQ from the D/A conversion unit 80 changes with a step width of the difference voltage VDF as indicated by D1 in FIG. 16.

In contrast, in the technique of the present embodiment, the output voltage VQ from the D/A conversion unit 80 changes with a voltage width VA smaller than the absolute value of the difference voltage VDF as indicated by D2 in FIG. 16. The voltage width VA is a change in the output voltage VQ, for example, in a period TDAC.

As indicated by D2 in FIG. 16, if the output voltage VQ from the D/A conversion unit 80 is changed so that the voltage width VA<the difference voltage VDF occurs, a change in an oscillation frequency from the oscillation circuit 150 is also considerably reduced compared with a case of D1. Therefore, the occurrence of frequency hopping as in FIG. 1C is minimized, and thus it is possible to prevent the occurrence of a communication error described in FIG. 9.

Specifically, in a case where a temperature changes from the first temperature to the second temperature, the digital signal processing unit 50 may output frequency control data DDS which changes in the unit of k'×LSB (changes by k'×LSB) from first data corresponding to the first temperature (first temperature detection data) to second data corresponding to the second temperature (second temperature detection data). Here, k' is an integer of 1 or greater. In addition, k' may or may not have the same value as k described above.

Figure 17A:
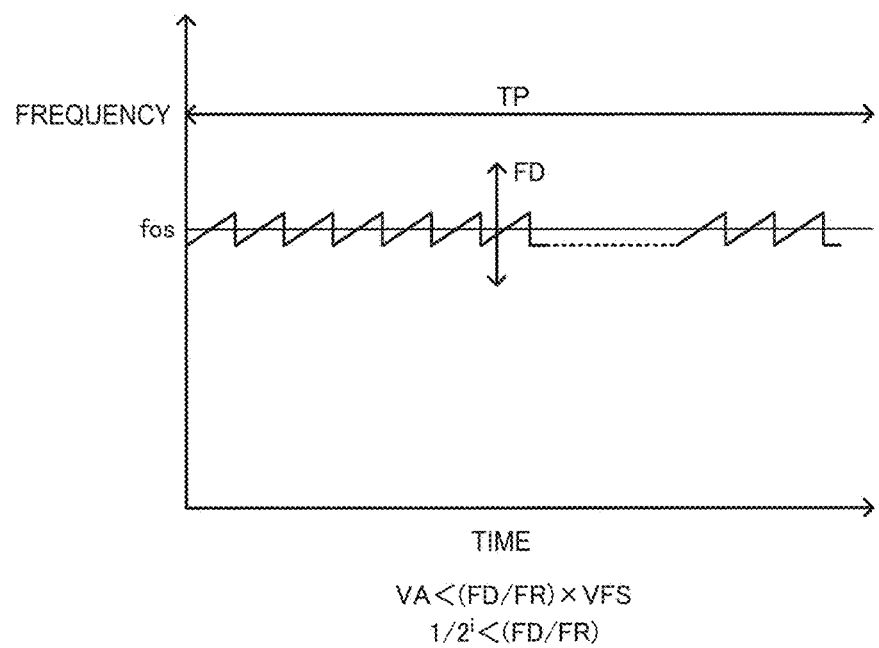
FIGS. 17A and 17B are diagrams for explaining a technique of minimizing frequency hopping or the like by using configurations other than the A/D conversion unit.
Figure 17B:
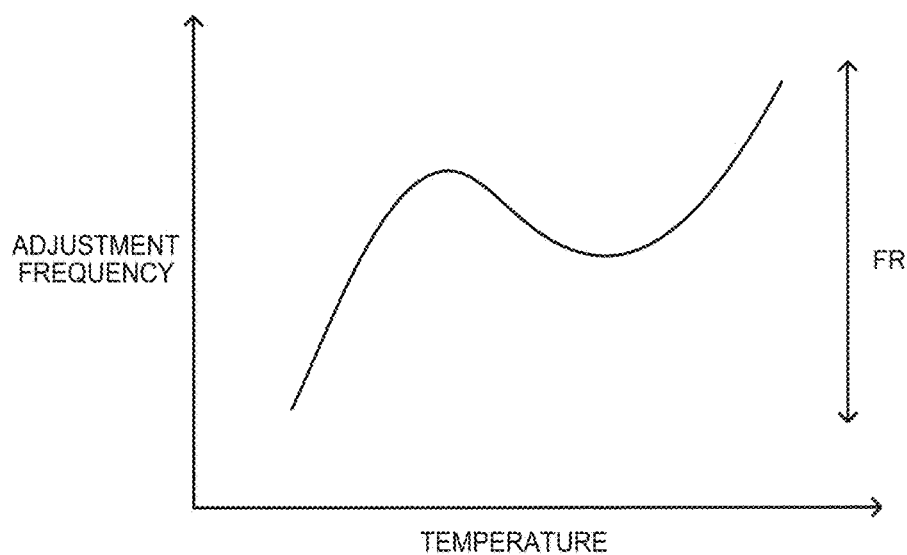

FIG. 17A is a diagram for explaining the technique of the present embodiment in a frequency domain. For example, a frequency variable range of an oscillation frequency from the oscillation signal generation circuit 140 (the D/A conversion unit 80 and the oscillation circuit 150) is indicated by FR. For example, the oscillation signal generation circuit 140 performs frequency adjustment as illustrated in FIG. 17B with respect to a temperature change, and a frequency variable range in this frequency adjustment is FR. In other words, if a temperature change enters the frequency variable range FR, a frequency can be adjusted by the oscillation signal generation circuit 140.

An allowable frequency drift of an oscillation frequency in a predetermined period TP is indicated by FD. For example, in order to prevent the occurrence of a communication error described in FIG. 9, a frequency drift of an oscillation frequency in the predetermined period TP is required to be included in the allowable frequency drift FD. If a frequency drift of an oscillation frequency is not included in the allowable frequency drift FD due to frequency hopping as illustrated in FIG. 1C, for example, a determination error occurs in a demodulation process of a received signal such as a GPS satellite signal, and thus a communication error occurs.

A full-scale voltage of the D/A conversion unit 80 is indicated by VFS. The D/A conversion unit 80 can change the output voltage VQ within a range of the full-scale voltage VFS. The full-scale voltage VFS corresponds to a voltage range, for example, in a case where the frequency control data DDS which is input to the D/A conversion unit 80 changes in a full range of 0 to $2^i$.

A change width of the output voltage VQ at a D/A conversion interval (TDAC) of the D/A conversion unit 80 described in FIG. 16 is indicated by VA. In this case, in the technique of the present embodiment, as illustrated in FIG. 17A, the following Expression (3) is established.

$$VA<(FD/FR) \times VFS \qquad (3)$$

Specifically, in a case where a resolution of the D/A conversion unit 80 is i bits, the following Expression (4) is established.

$$\tfrac{1}{2}^i < (FD/FR) \qquad (4)$$

If the technique of the present embodiment shown in the above Expressions (3) and (4) is adopted, as illustrated in FIG. 17A, a frequency drift of an oscillation frequency with respect to a nominal oscillation frequency fos (for example, about 16 MHz) can be caused to be included in the allowable frequency drift FD (for example, about several ppb) in the predetermined period TP (for example, 20 msec). Consequently, it is possible to prevent the occurrence of a communication error or the like due to frequency hopping described in FIG. 1C or the like.

For example, the right side in the above Expression (3), that is, (FD/FR)×VFS is obtained by multiplying a ratio (FD/FR) of the allowable frequency drift FD to the frequency variable range FR by the full-scale voltage VFS of the D/A conversion unit 80.

If the change width VA of the output voltage VQ at the D/A conversion interval (TDAC) of the D/A conversion unit 80 is made smaller than (FD/FR)×VFS, as illustrated in FIG. 17A, in the frequency domain, a frequency drift with respect to the nominal oscillation frequency fos can be caused to be included in the allowable frequency drift FD. In other words, the change width VA of the output voltage VQ from the D/A conversion unit 80 can be reduced as indicated by D2 in FIG. 16, and thus it is possible to prevent the occurrence of frequency hopping.

Figure 18:
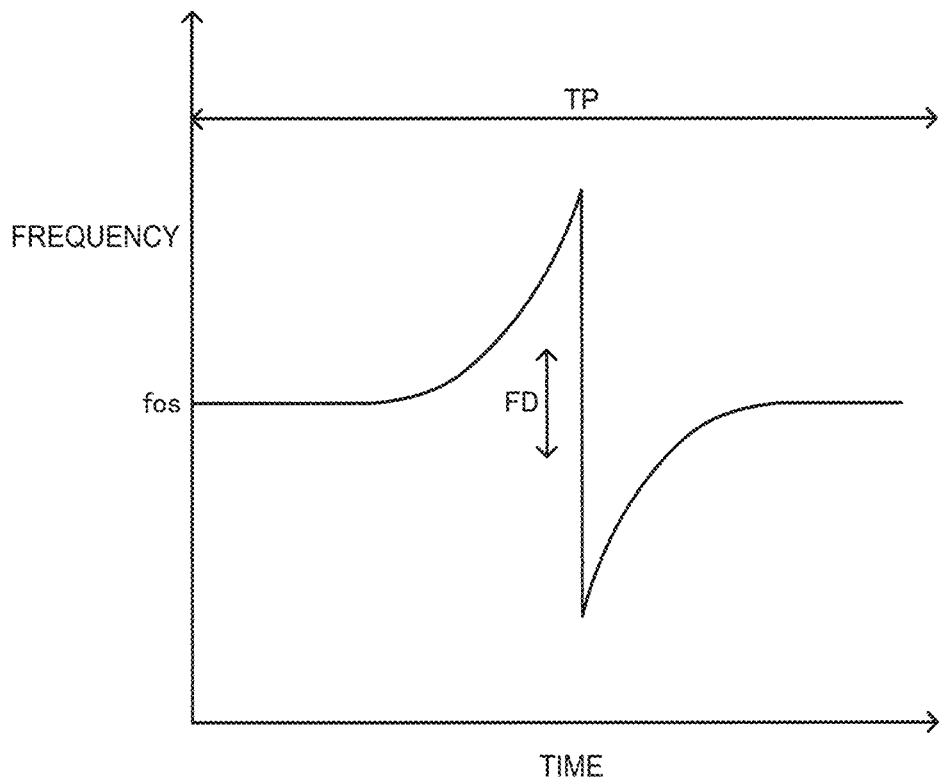
FIG. 18 is a diagram for explaining frequency hopping.

For example, if the above Expression (3) is not established, as illustrated in FIG. 18, a frequency drift with respect to the nominal oscillation frequency fos is not included in the allowable frequency drift FD, that is, frequency hopping occurs, and thus a communication error or the like described in FIG. 9 occurs. In the present embodiment, since the output voltage VQ from the D/A conversion unit 80 is changed so that the above Expression (3) is established, the occurrence of frequency hopping is minimized, and thus it is possible to prevent a communication error or the like.

There may be various configurations of the D/A conversion unit 80 for realizing the above-described technique. For example, the D/A conversion unit 80 may include a modulation circuit, a D/A converter, and a filter circuit (LPF). The digital signal processing unit 50 outputs the frequency control data DDS of i=m+n bits larger than n bits (for example, 16 bits) which is a resolution of the D/A converter. The digital signal processing unit 50 performs floating-point calculation in order to realize a digital signal process such as a temperature compensation process, and thus easily outputs the frequency control data DDS of i=m+n bits larger than n bits (for example, n=16 bits).

The modulation circuit performs modulation (PWM modulation or the like) of data of n bits among the data of i=m+n bits on the basis of data of m bits among the data of i=m+n bits, so as to output modulated data DM of n bits to the D/A converter. The filter circuit performs a smoothing process on an output voltage VDA which is obtained by the D/A converter performing D/A conversion on the data DM, and thus it is possible to realize D/A conversion of a high resolution such as i=m+n bits (for example, 20 bits).

4.2 Temperature Sensor Unit and Oscillation Circuit

Figure 19A:
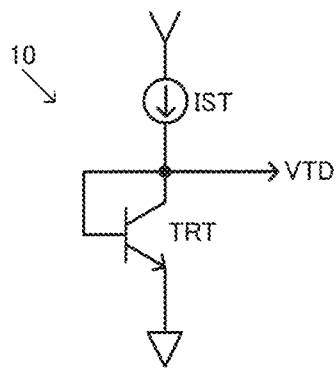
FIGS. 19A and 19B are diagrams illustrating specific configuration examples of a temperature sensor unit.

FIG. 19A illustrates a first configuration example of the temperature sensor unit 10. The temperature sensor unit 10 illustrated in FIG. 19A includes a current source IST, and a bipolar transistor TRT having a collector to which a current from the current source IST is supplied. The bipolar transistor TRT has a diode connection in which the collector is connected to a base thereof, and thus the temperature detection voltage VTD having temperature characteristics is output to a node of the collector of the bipolar transistor TRT. The temperature characteristics of the temperature detection voltage VTD are caused by temperature dependency of a voltage between the base and an emitter of the bipolar transistor TRT. As illustrated in FIG. 19C, the temperature detection voltage VTD has negative temperature characteristics (first-order temperature characteristics with a negative gradient).

Figure 19B:
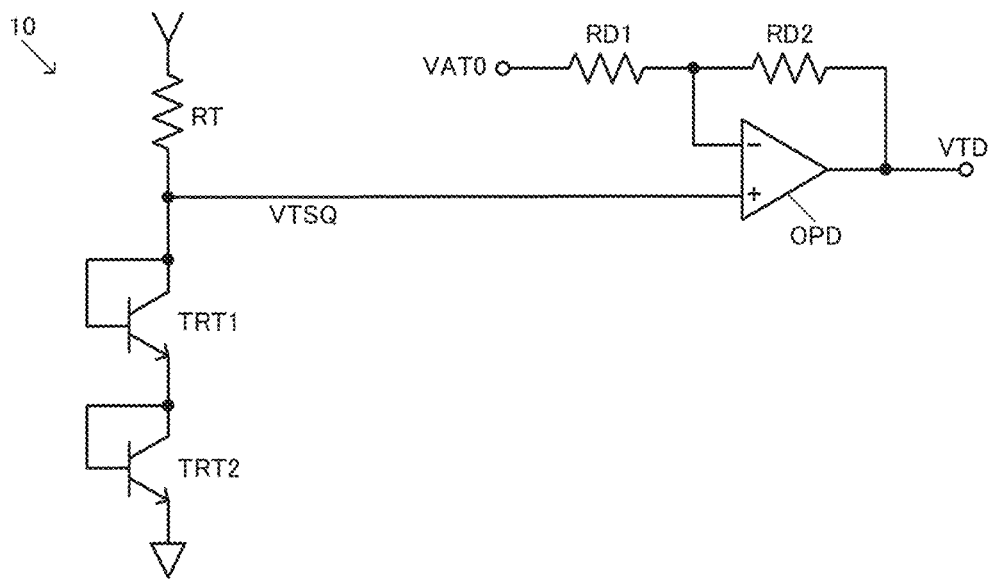
Figure 19C:
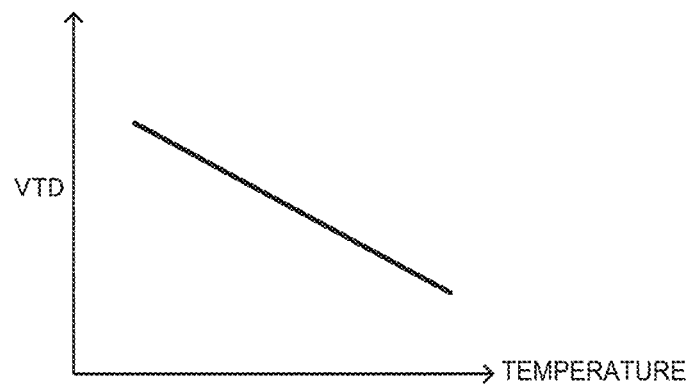
FIG. 19C is a diagram for explaining temperature characteristics.

FIG. 19B illustrates a second configuration example of the temperature sensor unit 10. In FIG. 19B, the current source IST illustrated in FIG. 19A is implemented by a resistor RT. One end of the resistor RT is connected to a node of a voltage power source, and the other end thereof is connected to a collector of a bipolar transistor TRT1. An emitter of the bipolar transistor TRT1 is connected to a collector of a bipolar transistor TRT2. Both of the bipolar transistors TRT1 and TRT2 have diode connections, and a voltage VTSQ which is output to a node of the collector of the bipolar transistor TRT1 has negative temperature characteristics (first-order temperature characteristics with a negative gradient) as illustrated in FIG. 19C.

The temperature sensor unit 10 illustrated in FIG. 19B is further provided with an operational amplifier OPD, and resistors RD1 and RD2. The voltage VTSQ is input to a non-inverting input terminal of the operational amplifier OPD, and one end of the resistor RD1 and one end of the resistor RD2 are connected to an inverting input terminal thereof. A reference temperature voltage VTA0 is supplied to the other end of the resistor RD1, and the other end of the resistor RD2 is connected to an output terminal of the operational amplifier OPD.

The operational amplifier OPD and the resistors RD1 and RD2 form an amplification amplifier which performs non-inverting amplification of the voltage VTSQ with the reference temperature voltage VAT0 as a reference. Consequently, the temperature sensor unit 10 outputs the temperature detection voltage VTD=VAT0+(1+RD2/RD1)×(VTSQ−VAT0). A reference temperature T0 can be adjusted by adjusting the reference temperature voltage VAT0.

Figure 20:
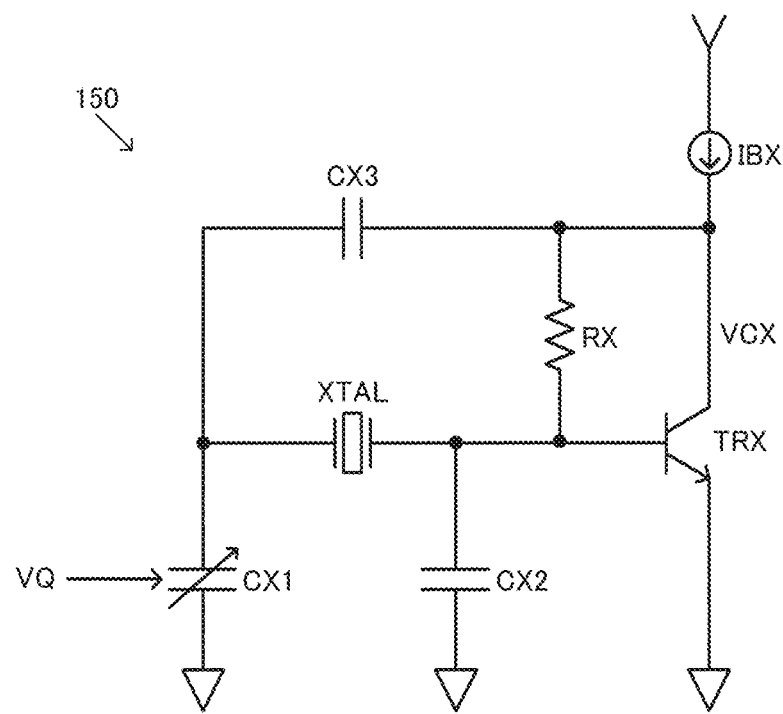
FIG. 20 illustrates a specific configuration example of an oscillation circuit.

FIG. 20 illustrates a configuration example of the oscillation circuit 150. The oscillation circuit 150 includes a current source IBX, a bipolar transistor TRX, a resistor RX, a variable capacitance capacitor CX1, and capacitors CX2 and CX3.

The current source IBX supplies a bias current to a collector of the bipolar transistor TRX. The resistor RX is provided between the collector and a base of the bipolar transistor TRX.

One end of the variable capacitance capacitor CX1 whose capacitance is variable is connected to a resonator XTAL. Specifically, one end of the variable capacitance capacitor CX1 is connected to one end of the resonator XTAL via a first resonator terminal (resonator pad) of the circuit device. One end of the capacitor CX2 is connected to the other end of the resonator XTAL. Specifically, one end of the capacitor CX2 is connected to the other end of the resonator XTAL via a second resonator terminal (resonator pad) of the circuit device. One end of the capacitor CX3 is connected to one end of the resonator XTAL, and the other end thereof is connected to the collector of the bipolar transistor TRX.

A base-emitter current caused by oscillation of the resonator XTAL flows through the bipolar transistor TRX. If the base-emitter current increases, a current between the collector and the emitter of the bipolar transistor TRX increases, and thus a bias current which branches to the resistor RX from the current source IBX is reduced so that a collector voltage VCX is lowered. On the other hand, if a current between the base and the emitter of the bipolar transistor TRX is reduced, a collector-emitter current is reduced, and thus a bias current which branches to the resistor RX from the current source IBX increases so that the collector voltage VCX is heightened. The collector voltage VCX is fed back to the resonator XTAL via the capacitor CX3.

An oscillation frequency of the resonator XTAL has temperature characteristics (for example, the temperature characteristics illustrated in FIG. 5), and the temperature characteristics are compensated by the output voltage VQ (frequency control voltage) from the D/A conversion unit 80. In other words, the output voltage VQ is input to the variable capacitance capacitor CX1, and thus a capacitance value of the variable capacitance capacitor CX1 is controlled by the output voltage VQ. If the capacitance value of the variable capacitance capacitor CX1 changes, a resonance frequency of an oscillation loop changes, and thus a variation in an oscillation frequency due to the temperature characteristics of the resonator XTAL is compensated for. The variable capacitance capacitor CX1 is implemented by, for example, a variable capacitance diode (varactor).

A configuration of the oscillation circuit 150 of the present embodiment is not limited to the configuration illustrated in FIG. 20, and may be variously modified. For example, in FIG. 20, the capacitor CX1 is used as a variable capacitance capacitor, but the capacitors CX2 or CX3 may be used as a variable capacitance capacitor which is controlled by the output voltage VQ. Some of the plurality of capacitors CX1 to CX3 may be used as variable capacitance capacitors.

5. Modification Examples

Figure 21:
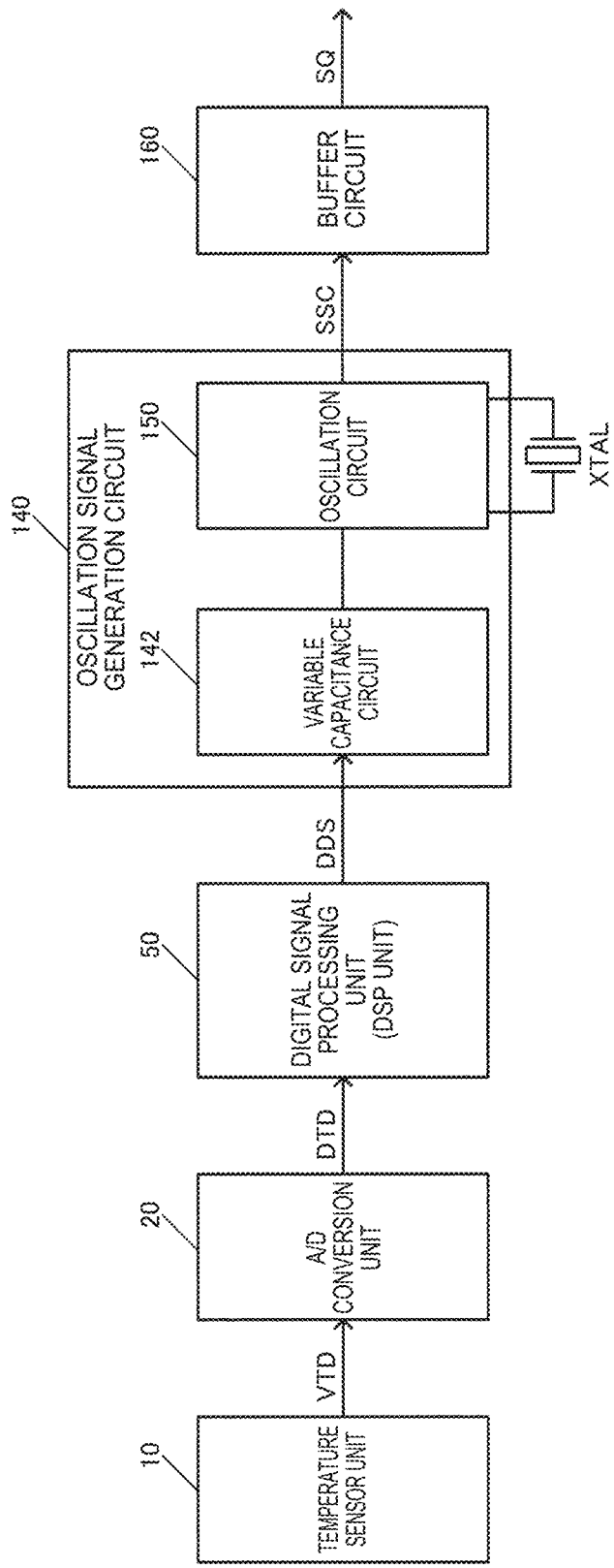
FIG. 21 illustrates a configuration example of a circuit device according to a modification example of the present embodiment.

Next, various modification examples of the present embodiment will be described. FIG. 21 illustrates a configuration example of a circuit device according to a modification example of the present embodiment. The circuit device illustrated in FIG. 21 includes an A/D conversion unit 20 which performs A/D conversion on temperature detection voltage VTD from a temperature sensor unit 10 so as to output temperature detection data DTD, a digital signal processing unit 50 which performs a temperature compensation process on an oscillation frequency on the basis of the temperature detection data DTD, so as to output frequency control data DDS of the oscillation frequency, and an oscillation signal generation circuit 140.

In a case where a temperature changes from a first temperature to a second temperature, the digital signal processing unit 50 outputs the frequency control data DDS which changes in the unit of k'×LSB from first data corresponding to the first temperature to second data corresponding to the second temperature. The oscillation signal generation circuit 140 generates an oscillation signal SSC having an oscillation frequency set by the frequency control data DDS by using the frequency control data DDS from the digital signal processing unit 50 and the resonator XTAL.

In other words, in FIG. 21, the D/A conversion unit 80 is not provided in the oscillation signal generation circuit 140 unlike FIG. 4. The oscillation frequency of the oscillation signal SSC generated by the oscillation signal generation circuit 140 is directly controlled on the basis of the frequency control data DDS from the digital signal processing unit 50. In other words, the oscillation frequency of the oscillation signal SSC is controlled without using the D/A conversion unit.

For example, in FIG. 21, the oscillation signal generation circuit 140 includes a variable capacitance circuit 142 and an oscillation circuit 150. The oscillation signal generation circuit 140 is not provided with the D/A conversion unit 80 illustrated in FIG. 4. The variable capacitance circuit 142 is provided instead of the variable capacitance capacitor CX1 illustrated in FIG. 20, and one end of the variable capacitance circuit 142 is connected to one end of the resonator XTAL.

A capacitance value of the variable capacitance circuit 142 is controlled on the basis of the frequency control data DDS from the digital signal processing unit 50. For example, the variable capacitance circuit 142 is provided with a plurality of capacitors (capacitor array), and a plurality of switch elements (switch array) each of which allows turning-on and turning-off to be controlled on the basis of the frequency control data DDS. Each of the plurality of switch elements is electrically connected to each of the plurality of capacitors. The plurality of switch elements are turned on or off, and thus the number of capacitors whose one ends are connected to one end of the resonator XTAL among the plurality of capacitors changes. Consequently, a capacitance value of the variable capacitance circuit 142 is controlled, and thus a capacitance value of one end of the resonator XTAL changes. Therefore, a capacitance value of the variable capacitance circuit 142 can be directly controlled by the frequency control data DDS, and thus an oscillation frequency of the oscillation signal SSC can be controlled.

As mentioned above, the technique of the present embodiment of changing the frequency control data DDS in the unit of k'×LSB can be realized by the configuration in which the oscillation signal generation circuit 140 is not provided with the D/A conversion unit 80 as illustrated in FIG. 21. Since the frequency control data DDS changes in the unit of k'×LSB, the same effect as in the technique of the present embodiment described in FIGS. 16 to 17B can be achieved. Therefore, it is possible to minimize the occurrence of frequency hopping as illustrated in FIG. 1C, and thus to prevent the occurrence of a communication error or the like caused by the frequency hopping. Also in the configuration illustrated in FIG. 21, the oscillation signal SSC may be generated according to a direct digital synthesizer method.

6. Oscillator, Electronic Apparatus, and Moving Object

Figure 22A:
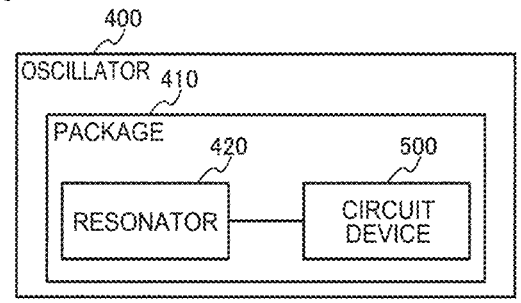
FIGS. 22A, 22B and 22C respectively illustrate configuration examples of an oscillator, an electronic apparatus, and a moving object.

FIG. 22A illustrates a configuration example of an oscillator 400 provided with a circuit device 500 of the present embodiment. As illustrated in FIG. 22A, the oscillator 400 includes a resonator 420 and the circuit device 500. The resonator 420 and the circuit device 500 are mounted in a package 410 of the oscillator 400. A terminal of the resonator 420 is electrically connected to a terminal (pad) of the circuit device 500 (IC) via an internal wiring of the package 410.

Figure 22B:
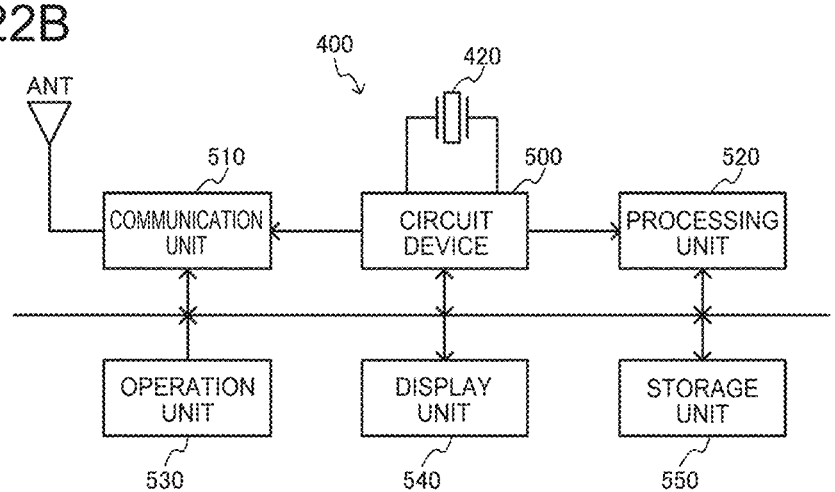

FIG. 22B illustrates a configuration example of an electronic apparatus including the circuit device 500 of the present embodiment. The electronic apparatus includes the circuit device 500 of the present embodiment, the resonator 420 such as a quartz crystal resonator, an antenna ANT, a communication unit 510, a processing unit 520, and the like. The electronic apparatus may include an operation unit 530, a display unit 540, and a storage unit 550. The oscillator 400 is formed of the resonator 420 and the circuit device 500. A configuration of the electronic apparatus is not limited to the configuration illustrated in FIG. 22B, and may be variously modified by omitting some constituent elements or adding other constituent elements thereto.

As the electronic apparatus illustrated in FIG. 22B, there may be various apparatuses, for example, a GPS built-in clock, a wearable apparatus such as a biological information measurement apparatus (a sphygmograph, a pedometer, or the like) or a head mounted display, a portable information terminal (mobile terminal) such as a smart phone, a mobile phone, a portable game apparatus, a notebook PC, or a tablet PC, a content providing terminal which delivers content, a video apparatus such as a digital camera or a video camera, and a network related apparatus such as a base station or a router.

The communication unit 510 (wireless circuit) performs a process of receiving data from an external apparatus or transmitting data to the external apparatus, via the antenna ANT. The processing unit 520 performs a process of controlling the electronic apparatus, or various digital processes on data which is transmitted and received via the communication unit 510. The function of the processing unit 520 may be realized by, for example, a processor such as a microcomputer.

The operation unit 530 is used for a user to perform an input operation, and may be implemented by, for example, an operation button or a touch panel display. The display unit 540 displays various pieces of information, and may be implemented by, for example, a liquid crystal display or an organic EL display. In a case where a touch panel display is used as the operation unit 530, the touch panel display also functions as the operation unit 530 and the display unit 540. The storage unit 550 stores data, and a function thereof may be realized by a semiconductor memory such as a RAM or a ROM, or a hard disk drive (HDD).

Figure 22C:
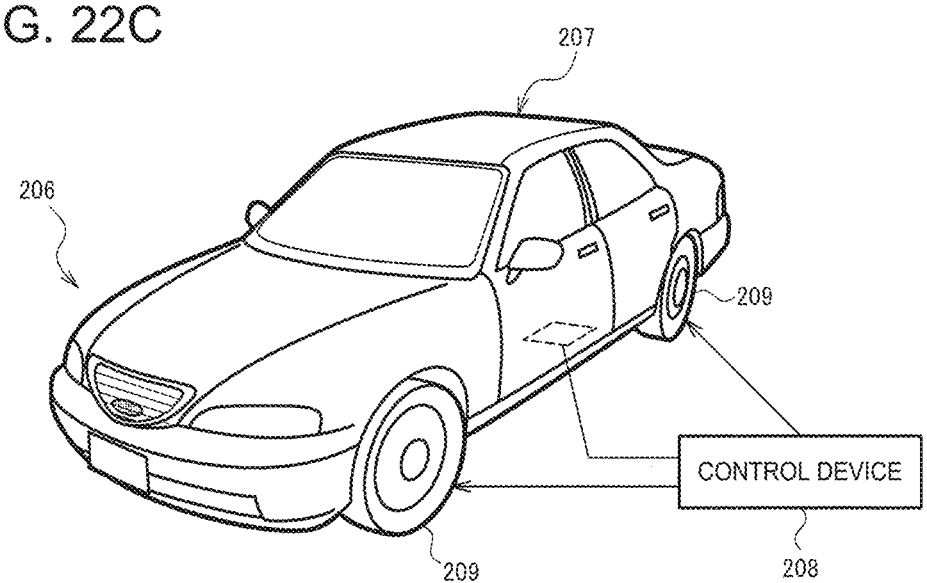

FIG. 22C illustrates an example of a moving object including the circuit device of the present embodiment. The circuit device (oscillator) of the present embodiment may be incorporated into, for example, various moving objects such as a car, an aircraft, a motorbike, a bicycle, and a ship. The moving objects are pieces of equipment or instruments which are provided with, for example, driving mechanisms such as engines or motors, steering mechanisms such as handles or rudders, and various electronic apparatuses (on-vehicle apparatuses), and move on the ground, in the air, and in the sea. FIG. 22C schematically illustrates an automobile 206 as a specific example of the moving object. The oscillator (not illustrated) including the circuit device and the resonator of the present embodiment is incorporated into the automobile 206. A control device 208 operates on the basis of a clock signal generated by the oscillator. The control device 208 controls hardness and softness of a suspension or a brake of each car wheel 209, for example, in accordance with the attitude of a car body 207. For example, automatic driving of the automobile 206 may be realized by the control device 208. An apparatus into which the circuit device or the oscillator of the present embodiment is incorporated is not limited to the control device 208, and the circuit device or the oscillator of the present embodiment may be incorporated into various apparatuses (on-vehicle apparatuses) provided in a moving object such as the automobile 206.

Although the present embodiment has been described as above in detail, it can be easily understood by a person skilled in the art that various modifications without substantially departing from the new matters and effects of the invention are possible. Therefore, these modifications are all included in the scope of the present disclosure. For example, in the specification or the drawings, the terminologies which are mentioned at least once along with different terminologies which have broader meanings or the same meanings may be replaced with the different terminologies in any location of the specification or the drawings. All combinations of the present embodiment and the modification examples are included in the scope of the present disclosure. In addition, configurations or operations of the circuit device, the oscillator, the electronic apparatus, or the moving object, A/D conversion techniques, D/A conversion techniques, frequency control data processing techniques, frequency control data outputting techniques in the processing portion, voltage outputting techniques in the D/A conversion unit, frequency control techniques for the resonator, and the like, are also not limited to the above description of the present embodiment, and may have various modifications.

The entire disclosure of Japanese Patent Application No. 2015-236403, filed Dec. 3, 2015 is expressly incorporated by reference herein.

What is claimed is:
1. A circuit device comprising:
a D/A converter;
a comparator configured to compare a temperature detection voltage from a temperature sensor with a D/A conversion voltage from the D/A converter; and
a processing circuit configured to execute a determination process on the basis of a comparison result from the comparator, and configured to obtain temperature detection data as a result of A/D conversion of the temperature detection voltage based on the determination process,
wherein, in a case where the minimum resolution of data in A/D conversion is indicated by LSB, the temperature detection data at a first output timing is set as first temperature detection data, and the temperature detection data at a second output timing following the first output timing is set as second temperature detection data, wherein the processing circuit obtains the temperature detection data and is configured to limit a change in the second temperature detection data so that the change in the second temperature detection data with respect to the first temperature detection data is limited, in each conversion, to one of adding 1 LSB to and subtracting 1 LSB from the first temperature detection data.

2. The circuit device according to claim 1, further comprising:
a register configured to store result data including intermediate result data or final result data,
wherein the processing circuit is configured to execute the determination process on the basis of a comparison result from the comparator, and configured to execute an update process on the result data on the basis of the determination process, and
wherein the D/A converter executes D/A conversion on the result data having undergone the update process.

3. The circuit device according to claim 2,
wherein the comparator is configured to compare the D/A conversion voltage into which the D/A converter converts the result data with the temperature detection voltage, and
wherein the processing circuit executes the determination process based on the comparison result, and executes the update process of updating the result data in a range of k×LSB or less.

4. The circuit device according to claim 2,
wherein the comparator compares the D/A conversion voltage into which the D/A converter converts the previous final result data corresponding to the temperature detection data at the previous output timing with the temperature detection voltage so as to output a first comparison result,
wherein the comparator compares the D/A conversion voltage into which the D/A converter converts data which is obtained by updating the previous final result data in the range of k×LSB or less, with the temperature detection voltage, so as to output a second comparison result, and
wherein the processing circuit executes the determination process based on the first comparison result and the second comparison result, and executes the update process of updating the previous final result data in the range of k×LSB or less on the basis of the determination process and of determining the updated data to be the present final result data.

5. The circuit device according to claim 2,
wherein the comparison circuit compares the D/A conversion voltage into which the D/A converter converts the previous final result data corresponding to the temperature detection data at the previous output timing with the temperature detection voltage so as to output a first comparison result,
wherein the comparator compares the D/A conversion voltage into which the D/A converter converts second data which is obtained by adding 1LSB to the previous final result data, with the temperature detection voltage, so as to output a second comparison result,
wherein, in a case where a result of the determination process based on the first comparison result is an up determination in which the temperature detection voltage is higher than the D/A conversion voltage, and a result of the determination process based on the second comparison result is also the up determination, the processing circuit determines the second data to be the present final result data, and
wherein, in a case where a result of the determination process based on the first comparison result is a down determination in which the temperature detection voltage is lower than the D/A conversion voltage, and a result of the determination process based on the second comparison result is also the down determination, the processing circuit determines data obtained by subtracting 1 LSB from the previous final result data, to be the present final result data.

6. The circuit device according to claim 2,
wherein the comparator compares the D/A conversion voltage into which the D/A converter converts the previous final result data corresponding to the temperature detection data at the previous output timing with the temperature detection voltage so as to output a first comparison result,
wherein the comparator compares the D/A conversion voltage into which the D/A converter converts second data which is obtained by subtracting 1 LSB from the previous final result data, with the temperature detection voltage, so as to output a second comparison result,
wherein, in a case where a result of the determination process based on the first comparison result is an up determination in which the temperature detection voltage is higher than the D/A conversion voltage, and a result of the determination process based on the second comparison result is also the up determination, the processing circuit determines data obtained by adding 1 LSB to the previous final result data, to be the present final result data, and
wherein, in a case where a result of the determination process based on the first comparison result is a down determination in which the temperature detection voltage is lower than the D/A conversion voltage, and a result of the determination process based on the second comparison result is also the down determination, the processing circuit determines the second data to be the present final result data.

7. The circuit device according to claim 5,
wherein, in a case where one of a result of the determination process based on the first comparison result and a result of the determination process based on the second comparison result is the up determination, and the other thereof is the down determination, the processing circuit determines the previous final result data to be the present final result data.

8. The circuit device according to claim 6,
wherein, in a case where one of a result of the determination process based on the first comparison result and a result of the determination process based on the second comparison result is the up determination, and the other thereof is the down determination, the processing circuit determines the previous final result data to be the present final result data.

9. The circuit device according to claim 1,
wherein an A/D conversion period is set so that a change amount of the temperature detection voltage in a single A/D conversion period is equal to or less than a voltage corresponding to k×LSB.

10. The circuit device according to claim 2,
wherein an A/D conversion period is set so that a change amount of the temperature detection voltage in a single A/D conversion period is equal to or less than a voltage corresponding to k×LSB.

11. The circuit device according to claim 1, further comprising:
an A/D conversion unit that includes the D/A converter, the comparator, and the processing circuit;
a digital signal processing circuit configured to execute a temperature compensation process on an oscillation frequency on the basis of the temperature detection data, so as to output frequency control data of the oscillation frequency; and an oscillation signal generation circuit that generates an oscillation signal having the oscillation frequency set by the frequency control data by using the frequency control data from the digital signal processing circuit and a resonator.

12. The circuit device according to claim 2, further comprising:
an A/D conversion unit that includes the D/A converter, the comparator, and the processing circuit;
a digital signal processing circuit configured to execute a temperature compensation process on an oscillation frequency based on the temperature detection data, so as to output frequency control data of the oscillation frequency; and
an oscillation signal generation circuit that generates an oscillation signal having the oscillation frequency set by the frequency control data by using the frequency control data from the digital signal processing circuit and a resonator.

13. An oscillator comprising:
the circuit device according to claim 11; and
the resonator.

14. An oscillator comprising:
the circuit device according to claim 12; and
the resonator.

15. An electronic apparatus comprising the circuit device according to claim 1.

16. An electronic apparatus comprising the circuit device according to claim 2.

17. An electronic apparatus comprising the circuit device according to claim 11.

18. A moving object comprising the circuit device according to claim 1.

19. A moving object comprising the circuit device according to claim 2.

20. A moving object comprising the circuit device according to claim 11.

* * * * *